US012787439B2

(12) United States Patent
Lee et al.

(10) Patent No.: US 12,787,439 B2
(45) Date of Patent: Nov. 3, 2026

(54) DISPLAY PANEL AND DISPLAY DEVICE

(71) Applicant: LG Display Co., Ltd., Seoul (KR)

(72) Inventors: Dohyung Lee, Paju-si (KR); ChanYong Jeong, Paju-si (KR); JuHeyuck Baeck, Seoul (KR); Younghyun Ko, Paju-si (KR); HongRak Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 405 days.

(21) Appl. No.: 18/381,525

(22) Filed: Oct. 18, 2023

(65) Prior Publication Data

US 2024/0162239 A1 May 16, 2024

(30) Foreign Application Priority Data

Nov. 14, 2022 (KR) ........................ 10-2022-0151748

(51) Int. Cl.
*H10D 86/60* (2025.01)
*H10D 86/40* (2025.01)
(Continued)

(52) U.S. Cl.
CPC ........... *H10D 86/60* (2025.01); *H10D 86/411* (2025.01); *H10D 86/423* (2025.01);
(Continued)

(58) Field of Classification Search
CPC .... H10D 86/60; H10D 86/411; H10D 86/421; H10D 86/423; H10D 86/431; H10D 86/441; H10D 86/481; H10D 30/6757; H10D 30/6755; H10D 30/6723; H10D 30/031; H10D 30/0312; H10D 30/0316; H10D 30/0321; H10D 30/6713; H10D 30/6725; H10D 30/6729; H10D 30/6732;
(Continued)

(56) References Cited

U.S. PATENT DOCUMENTS 5,122,849 A * 6/1992 Tanaka ............... H10D 30/6717 257/E29.279
2009/0294857 A1 12/2009 Lee
(Continued)

FOREIGN PATENT DOCUMENTS

CN 107068694 A 8/2017
CN 114975486 A 8/2022
(Continued)

*Primary Examiner* — Natalia A Gondarenko
(74) *Attorney, Agent, or Firm* — Birch, Stewart, Kolasch & Birch, LLP

(57) ABSTRACT

Discussed are a display panel and a display device including thin film transistors having high reliability and a high current producing characteristic. In one example, the display panel includes a first active layer disposed on a substrate and including a first channel region, a second active layer overlapping a portion of the first active layer and including a second channel region not overlapping the first channel region of the first active layer, first and second electrodes disposed in respective portions of the first and second active layers, respectively, and spaced apart from each other, a gate insulating layer disposed in respective portions of upper surfaces of the first and second active layers, and a third electrode disposed on the gate insulating layer.

30 Claims, 28 Drawing Sheets

(51) Int. Cl.
*H10K 59/121* (2023.01)
*H10P 14/20* (2026.01)

(52) U.S. Cl.
CPC ....... *H10D 86/441* (2025.01); *H10P 14/2918* (2026.01); *H10K 59/1213* (2023.02)

(58) Field of Classification Search
CPC ...... H10D 30/675; H10D 62/80; H10D 62/82; H10D 62/8271; H10D 62/86; H10D 62/875; H10D 64/257; H10P 14/2918; H10K 59/1213; H10K 59/122; H10K 59/123; H10K 59/124; H10K 59/126; G02F 1/1368; G02F 1/136209
USPC ............................................................ 257/43
See application file for complete search history.

(56) References Cited

U.S. PATENT DOCUMENTS

| | | | | |
|---|---|---|---|---|
| 2011/0017992 | A1* | 1/2011 | Jinbo | H10D 30/0321 257/E29.294 |
| 2012/0187396 | A1 | 7/2012 | Yamazaki et al. | |
| 2013/0009219 | A1* | 1/2013 | Yamazaki | H10D 30/6756 257/E21.409 |
| 2014/0264324 | A1* | 9/2014 | Yamazaki | H10D 30/6757 257/43 |
| 2016/0315104 | A1* | 10/2016 | Han | H10D 86/421 |
| 2017/0125604 | A1 | 5/2017 | Oshima | |
| 2018/0175077 | A1 | 6/2018 | Koo et al. | |
| 2018/0350995 | A1* | 12/2018 | Kim | H10D 30/6755 |
| 2019/0280126 | A1* | 9/2019 | Kikuchi | H10D 30/6755 |
| 2020/0105799 | A1 | 4/2020 | Yuan | |
| 2020/0119120 | A1* | 4/2020 | Feng | H10K 59/126 |
| 2021/0320162 | A1* | 10/2021 | Jeon | H10D 86/60 |
| 2022/0328591 | A1 | 10/2022 | Sun | |

FOREIGN PATENT DOCUMENTS

| | | | |
|---|---|---|---|
| GB | 2613685 | A | 6/2023 |
| GB | 2614391 | A | 7/2023 |
| JP | 2009-42436 | A | 2/2009 |
| JP | 2013-225551 | A | 10/2013 |
| JP | 2019-110296 | A | 7/2019 |
| KR | 10-0542985 | B1 | 1/2006 |
| KR | 10-2015-0085385 | A | 7/2015 |
| TW | 202420569 | A | 5/2024 |

* cited by examiner

DISPLAY PANEL AND DISPLAY DEVICE

CROSS-REFERENCE TO RELATED APPLICATION

This application claims priority to Korean Patent Application No. 10-2022-0151748, filed on Nov. 14, 2022 in the Korean Intellectual Property Office, the entire disclosure of which is hereby expressly incorporated by reference into the present application.

BACKGROUND

Technical Field

The present disclosure relates to electronic devices with a display, and more specifically, to a display panel and a display device.

Discussion of the Related Art

Thin film transistors are widely used as switching devices or driving devices in the field of electronic devices.

In particular, since thin film transistors can be manufactured on a glass substrate or a plastic substrate, they are increasingly used as switching devices or driving devices in display devices such as a liquid crystal display device, an organic light emitting display device, a quantum dot display device, and/or the like.

As the reliability of such transistors can be reduced due to various reasons, or an amount of current produced by the transistors can be reduced, electrical characteristics of corresponding display devices can also be reduced.

SUMMARY OF THE DISCLOSURE

Some display devices have suffered from a reduction in electrical characteristics of these display devices by low reliability or a low amount of current due to a structural attribute of an active layer.

As such, one or more embodiments of the present disclosure can provide a display panel and a display device that are capable of addressing these issues and other limitations associated with the related art.

One or more embodiments of the present disclosure can provide a display panel and a display device that include one or more thin film transistors with high electron mobility and improved reliability.

One or more embodiments of the present disclosure can provide a display panel and a display device that include one or more thin film transistors with high current and high reliability, which are located in a non-display area, by enabling the one or more transistors to have characteristics of producing a high level of current.

According to aspects of the present disclosure, a display panel can include a substrate; a first active layer disposed on the substrate and including a first channel region; a second active layer overlapping a portion of the first active layer, including a second channel region not overlapping the first channel region of the first active layer; first and second electrodes disposed in respective portions of the first and second active layers, respectively, and spaced apart from each other; a gate insulating layer disposed in respective portions of upper surfaces of the first and second active layers; and a third electrode disposed on the gate insulating layer. The first channel region of the first active layer and the second channel region of the second active layer can be connected in parallel to each other.

According to aspects of the present disclosure, a display device includes a display panel and a driving circuit configured to drive the display panel, The display panel can include a substrate; a first active layer disposed on the substrate and including a first channel region; a second active layer overlapping a portion of the first active layer, and including a second channel region not overlapping the first channel region of the first active layer; first and second electrodes disposed in respective portions of the first and second active layers, respectively, and spaced apart from each other; a gate insulating layer disposed in respective portions of upper surfaces of the first and second active layers; and a third electrode disposed on the gate insulating layer.

According to one or more embodiments of the present disclosure, a display panel and a display device can be provided that have a structure in which one thin film transistor includes active layers including different materials, and channel regions of the active layers are connected in parallel. Thereby, the display panel and the display device can have high capability and produce high performance by including thin film transistors with a high current producing characteristic and high reliability.

According to one or more embodiments of the present disclosure, a display panel and a display device can be provided that have a structure in which one transistor is configured to have a plurality of first channel regions and a plurality of second channel regions, which are alternately disposed. Thereby, the display panel and the display device can have high capability and produce high performance by including thin film transistors with a high current producing characteristic and high reliability disposed in a non-display area.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings.

DETAILED DESCRIPTION OF THE EMBODIMENTS

Figure 1:
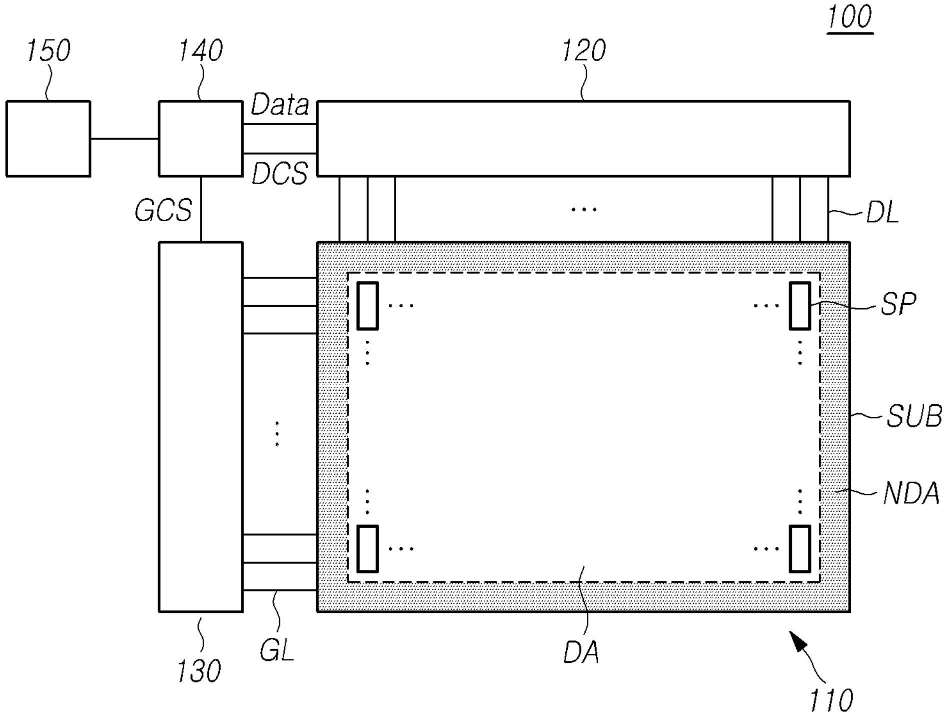
FIG. 1 illustrates an example system configuration of a display device according to aspects of the present disclosure.

Reference will now be made in detail to embodiments of the present disclosure, examples of which can be illustrated in the accompanying drawings.

In the following description, the structures, embodiments, implementations, methods and operations described herein are not limited to the specific example or examples set forth herein and can be changed as is known in the art, unless otherwise specified. Like reference numerals designate like elements throughout, unless otherwise specified. Names of the respective elements used in the following explanations are selected only for convenience of writing the specification and can thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the protected scope of the present disclosure is defined by claims and their equivalents.

In the following description, where the detailed description of the relevant known function or configuration can unnecessarily obscure aspects of the present disclosure, a detailed description of such known function or configuration can be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms “comprise,” “have,” “include,” “contain,” “constitute,” and the like are used, one or more other elements can be added unless the term, such as “only,” is used. An element described in the singular form is intended to include a plurality of elements, and vice versa, unless the context clearly indicates otherwise.

Although the terms “first,” “second,” A, B, (a), (b), and the like can be used herein to describe various elements, these elements should not be interpreted to be limited by these terms as they are not used to define a particular order, sequence or precedence. These terms are used only to distinguish one element from another. For example, a first element could be termed a second element, and, similarly, a second element could be termed a first element, without departing from the scope of the present disclosure.

When it is mentioned that a first element “is connected or coupled to”, “overlaps” etc. a second element, it should be interpreted that, not only can the first element “be directly connected or coupled to” or “directly contact or overlap” the second element, but a third element can also be “interposed” between the first and second elements, or the first and second elements can “be connected or coupled to”, “overlap”, etc. each other via a fourth element. Here, the second element can be included in at least one of two or more elements that “are connected or coupled to”, “contact or overlap”, etc. each other.

Where positional relationships are described, for example, where the positional relationship between two parts is described using “on,” “over,” “under,” “above,” “below,” “beside,” “next,” or the like, one or more other parts can be located between the two parts unless a more limiting term, such as “immediate(ly),” “direct(ly),” or “close(ly)” is used. For example, where an element or layer is disposed “on” another element or layer, one or more third element(s) or layer(s) can be interposed therebetween. Furthermore, the terms “left,” “right,” “top,” “bottom”, “downward,” “upward,” “upper,” “lower,” and the like refer to an arbitrary frame of reference.

In addition, when any dimensions, relative sizes etc. are mentioned, it should be considered that numerical values for an elements or features, or corresponding information (e.g., level, range, etc.) include a tolerance or error range that can be caused by various factors (e.g., process factors, internal or external impact, noise, etc.) even when a relevant description is not specified. Further, the term “may” fully encompasses all the meanings of the term “can”.

Hereinafter, various embodiments of the present disclosure will be described in detail with reference to the accompanying drawings. All the components of each display device according to all embodiments of the present disclosure are operatively coupled and configured. In addition, for convenience of description, a scale in which each of elements is illustrated in the accompanying drawings can differ from an actual scale. Thus, the illustrated elements are not limited to the specific scale in which they are illustrated in the drawings.

FIG. 1 illustrates an example system configuration of a display device 100 according to aspects of the present disclosure.

Referring to FIG. 1, the display device 100 according to aspects of the present disclosure can include a display panel 110 and a driving circuit for driving the display panel 110.

The driving circuit can include a data driving circuit 120, a gate driving circuit 130, and the like, and further include a controller 140 for controlling the data driving circuit 120 and the gate driving circuit 130.

The display panel 110 can include a substrate SUB, and signal lines such as a plurality of data lines DL, a plurality of gate lines GL, and the like disposed on the substrate SUB. The display panel 110 can include a plurality of subpixels SP connected to the plurality of gate lines GL and the plurality of data lines DL.

The display panel 110 can include a display area DA in which one or more images can be displayed and a non-display area NDA located outside of the display area DA and not allowing an image to be displayed. For example, a plurality of subpixels SP for displaying images can be disposed in the display area DA of the display panel 110. The driving circuits (120, 130, and 140) can be electrically connected to, or can be mounted on, the non-display area NDA of the display panel 110, and further, one or more pads to which one or more integrated circuits or one or more printed circuits are connected, can be disposed in the non-display area NDA.

The data driving circuit 120 can be a circuit for driving the plurality of data lines DL, and can supply data signals to the plurality of data lines DL. The gate driving circuit 130 can be a circuit for driving the plurality of gate lines GL, and can supply gate signals to the plurality of gate lines GL. The controller 140 can supply a data control signal DCS to the data driving circuit in order to control an operation time of the data driving circuit 120. The controller 140 can supply a gate control signal GCS to the gate driving circuit 130 in order to control an operation time of the gate driving circuit 130.

The controller 140 can control scanning operation to be started according to a respective time processed for each frame, convert image data inputted from other devices or other image providing sources (e.g., host systems) to a data signal form used in the data driving circuit and then supply image data Data resulting from the converting to the data driving circuit 120, and control data driving to be performed at a predefined time according to a scan process.

In order to control the gate driving circuit 130, the controller 140 can supply several types of gate control signals GCS such as a gate start pulse (GSP), a gate shift clock (GSC), a gate output enable signal (GOE), and the like.

In order to control the data driving circuit 120, the controller 140 can supply several types of data control signals DCS such as a source start pulse (SSP), a source sampling clock (SSC), a source output enable (SOE) signal, and the like.

The controller 140 can be implemented as a separate component from the data driving circuit 120, or integrated with the data driving circuit 120 and thus implemented in a single integrated circuit.

The data driving circuit 120 can drive a plurality of data lines DL by supplying data voltages corresponding to image data Data received from the controller 140 to the plurality of data lines DL. The data driving circuit 120 can also be referred to as a source driving circuit.

The data driving circuit 120 can include, for example, one or more source driver integrated circuits (SDIC).

In one or more embodiments, each source driver integrated circuit (SDIC) can be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

The gate driving circuit 130 can supply a gate signal of a turn-on level voltage or a gate signal of a turn-off level voltage according to the control of the controller 140. The gate driving circuit 130 can sequentially drive a plurality of gate lines GL by sequentially supplying gate signals of the turn-on level voltage to the plurality of gate lines GL.

For example, the gate driving circuit 130 can be connected to the display panel using the tape-automated-bonding (TAB) technique, or connected to a conductive pad such as a bonding pad of the display panel 110 using the chip-on-glass (COG) technique or the chip-on-panel (COP) technique, or connected to the display panel 110 using the chip-on-film (COF) technique. In one or more embodiments, the gate driving circuit 130 can be disposed in the non-display area NDA of the display panel 110 using a gate-in-panel (GIP) technique. The gate driving circuit 130 can be disposed on a substrate SUB, or connected to the substrate SUB. In an example where the gate driving circuit 130 is implemented with the GIP technique, the gate driving circuit can be disposed in the non-display area NDA of the substrate SUB. The gate driving circuit can be connected to the substrate SUB in examples where the gate driving circuit 130 is implemented with the chip-on-glass (COG) technique, the chip-on-film (COF) technique, or the like.

For example, at least one of the data driving circuit 120 and the gate driving circuit can be disposed in the display area DA. In this example, at least one of the data driving circuit and the gate driving circuit 130 can be disposed not to overlap subpixels SP, or disposed to be overlapped with one or more, or all, of the subpixels SP.

When a specific gate line is selected and driven by the gate driving circuit 130, the data driving circuit 120 can convert image data Data received from the controller 140 into data voltages in an analog form and supply the data voltages resulting from the converting to a plurality of data lines DL.

The data driving circuit 120 can be located in, and/or electrically connected to, but not limited to, only one side or portion (e.g., an upper edge or a lower edge) of the display panel 110. In one or more embodiments, the data driving circuit 120 can be located in, and/or electrically connected to, but not limited to, two sides or portions (e.g., an upper edge and a lower edge) of the display panel 110 or at least two of four sides or portions (e.g., the upper edge, the lower edge, a left edge, and a right edge) of the display panel 110 according to driving schemes, panel design schemes, or the like.

The gate driving circuit 130 can be located in, and/or electrically connected to, but not limited to, only one side or portion (e.g., a left edge or a right edge) of the display panel 110. In one or more embodiments, the gate driving circuit 130 can be located in, and/or electrically connected to, but not limited to, two sides or portions (e.g., a left edge and a right edge) of the display panel 110 or at least two of four sides or portions (e.g., an upper edge, a lower edge, the left edge, and the right edge) of the display panel 110 according to driving schemes, panel design schemes, or the like.

The controller 140 can be a timing controller used in the typical display technology or a control apparatus/device capable of additionally performing other control functionalities in addition to the typical function of the timing controller. In one or more embodiments, the controller 140 can be one or more other control circuits different from the timing controller, or a circuit or component in the control apparatus/device. The controller 140 can be implemented using various circuits or electronic components such as an integrated circuit (IC), a field programmable gate array (FPGA), an application specific integrated circuit (ASIC), a processor, and/or the like.

The controller 140 can be mounted on a printed circuit board, a flexible printed circuit, or the like, and can be electrically connected to the data driving circuit 120 and the gate driving circuit 130 through the printed circuit board, the flexible printed circuit, or the like.

In one or more aspects, the display device 100 can be a display including a backlight unit such as a liquid crystal display device, or can be a self-emissive display such as an organic light emitting diode (OLED) display, a quantum dot (QD) display, a micro light emitting diode (M-LED) display, and the like.

In an embodiment where the display device 100 according to aspects of the present disclosure is an OLED display or is implemented using an OLED display, each subpixel SP can include, as a light emitting element, an organic light emitting diode (OLED), which is a self-emission element. In an embodiment where the display device 100 according to aspects of the present disclosure is a QD display or is implemented using a QD display, each subpixel SP can include a light emitting element configured with quantum dots, which are self-emission semiconductor crystals. In an embodiment where the display device 100 according to aspects of the present disclosure is a micro LED display or is implemented using a micro LED display, each subpixel SP can include, as a light emitting element, a micro light emitting diode (Micro LED), which is a self-emission element and including an inorganic material.

Figure 2:
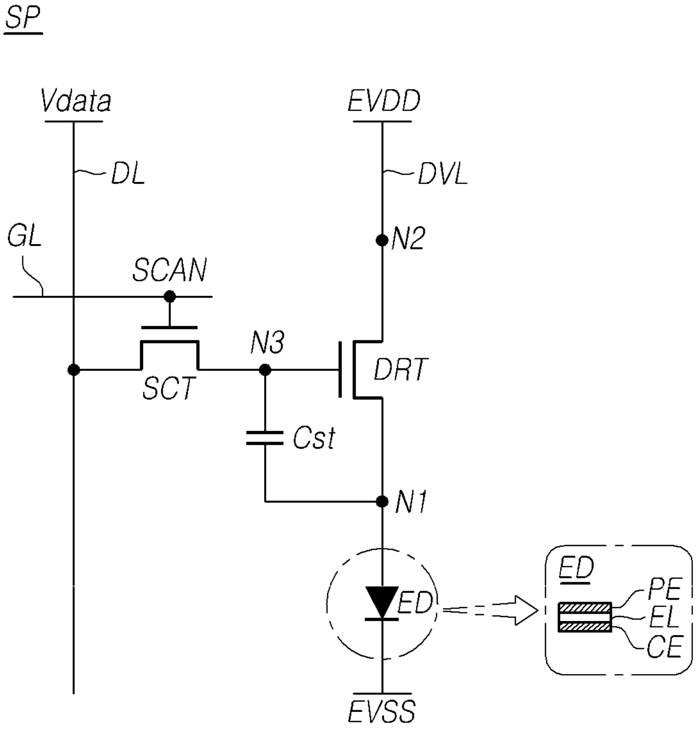
FIG. 2 illustrates an example equivalent circuit of a subpixel included in the display device according to aspects of the present disclosure.
Figure 3:
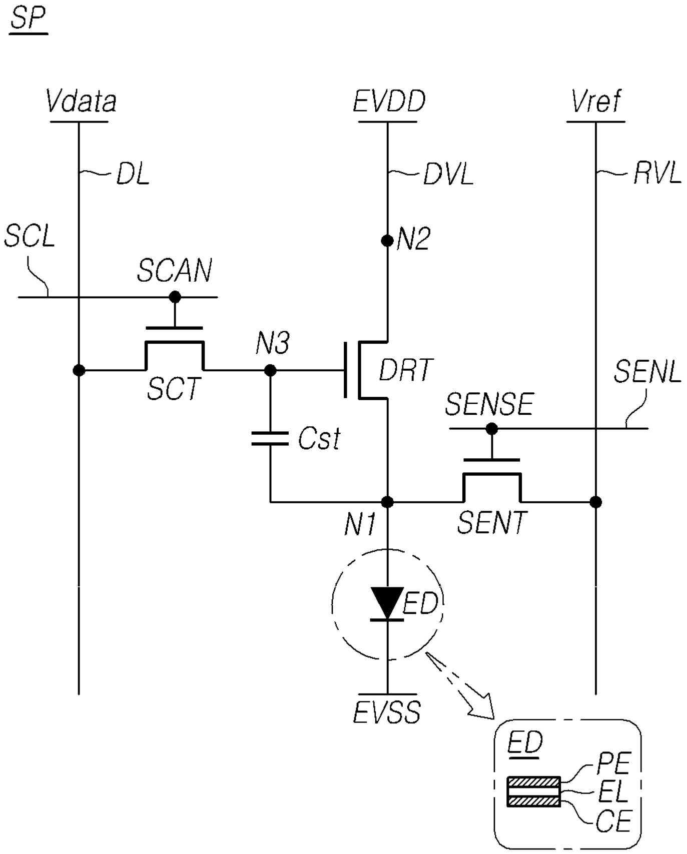
FIG. 3 illustrates another example equivalent circuit of a subpixel included in the display device according to aspects of the present disclosure.

FIG. 2 illustrates an example equivalent circuit of a subpixel SP included in the display device 100 according to aspects of the present disclosure. FIG. 3 illustrates another example equivalent circuit of a subpixel SP included in the display device 100 according to aspects of the present disclosure.

Referring to FIG. 2, in one or more embodiments, each of a plurality of subpixels SP disposed in the display panel 110 of the display device 100 according to aspects of the present disclosure can include a light emitting element ED such as a light emitting diode etc., a driving thin film transistor DRT, a scanning thin film transistor SCT, and a storage capacitor Cst.

Referring to FIG. 2, the light emitting element ED can include a pixel electrode PE and a common electrode CE, and include an emission layer EL located between the pixel electrode PE and the common electrode CE.

The pixel electrode PE of the light emitting element ED can be an electrode disposed in each subpixel SP, and the common electrode CE can be an electrode shared by all or at least some of the plurality of subpixels SP. For example, the pixel electrode PE can be an anode electrode and the common electrode CE can be a cathode electrode. In another example, the pixel electrode PE can be a cathode electrode and the common electrode CE can be an anode electrode.

In one or more embodiments, the light emitting element ED can be an organic light emitting diode (OLED), a light emitting diode (LED), a quantum dot light emitting element or the like.

The driving thin film transistor DRT can be a thin film transistor for driving the light emitting element ED, and for example, include a first node N1, a second node N2, and a third node N3.

The first node N1 of the driving thin film transistor DRT can be a source node (or a source electrode) or a drain node (or a drain electrode) of the driving thin film transistor DRT, and be electrically connected to the pixel electrode PE of the light emitting element ED. The second node N2 of the driving thin film transistor DRT can be the drain node (or the drain electrode) or the source node (or the source electrode) of the driving thin film transistor DRT, and be electrically connected to a driving voltage line DVL for supplying a driving voltage EVDD. The third node N3 of the driving thin film transistor DRT can be a gate node (or a gate electrode) of the driving thin film transistor DRT, and be electrically connected to a source node (or a source electrode) or a drain node (or a drain electrode) of the scanning thin film transistor SCT.

The scanning thin film transistor SCT can be turned on or off by a scanning scan signal SCAN, which is a type of gate signal, and can be connected between the third node N3 of the driving thin film transistor DRT and a data line DL. In other words, the scanning thin film transistor SCT can be turned on or off by a scanning gate signal SCAN carried through a scanning gate line SCL, which is a type of gate line GL, and can control an electrical connection between the data line DL and the third node N3 of the driving thin film transistor DRT.

The scanning thin film transistor SCT can be turned on by a scanning gate signal SCAN with a turn-on level voltage and transfer a data voltage Vdata supplied through the data line DL to the third node N3 of the driving thin film transistor DRT.

In an example where the scanning thin film transistor SCT is an n-type transistor, the turn-on level voltage of the scanning gate signal SCAN can be a high level voltage. In another example where the scanning thin film transistor SCT is a p-type transistor, the turn-on level voltage of the scanning gate signal SCAN can be a low level voltage.

The storage capacitor Cst can be connected between the first node N1 and the third node N3 of the driving thin film transistor DRT. The storage capacitor Cst can store an amount of electric charge corresponding to a voltage difference between both terminals thereof and maintain the voltage difference between both terminals for a predetermined frame time. Accordingly, the subpixel SP can emit light for the predetermined frame time.

Referring to FIG. 3, in one or more embodiments, each of a plurality of subpixels SP disposed in the display panel 110 of the display device 100 according to aspects of the present disclosure can further include a sensing thin film transistor SENT.

The sensing thin film transistor SENT can be turned on or off by a sensing gate signal SENSE, which is a type of gate signal, and can be connected between the first node N1 of the driving thin film transistor DRT and a reference voltage line RVL. In other words, the sensing thin film transistor SENT can be turned on or off by a sensing gate signal SENSE carried through a sensing gate line SENL, which is another type of gate line GL, and can control an electrical connection between the reference voltage line RVL and the first node N1 of the driving thin film transistor DRT.

The sensing thin film transistor SENT can be turned on by a sensing gate signal SENSE with a turn-on level voltage and transfer a reference voltage Vref supplied through the reference voltage line RVL to the first node N1 of the driving thin film transistor DRT.

Further, the sensing thin film transistor SENT can be turned on by a sensing gate signal SENSE with a turn-on level voltage, and transfer a voltage in the first node N1 of the driving thin film transistor DRT to the reference voltage line RVL.

In an example where the sensing thin film transistor SENT is an n-type transistor, the turn-on level voltage of the sensing gate signal SENSE can be a high level voltage. In another example where the sensing thin film transistor SENT is a p-type transistor, the turn-on level voltage of the sensing gate signal SENSE can be a low level voltage.

The function of the sensing thin film transistor SENT transferring the voltage of the second node N2 of the driving thin film transistor DRT to the reference voltage line RVL can be used in a sensing driving or a sensing mode for sensing at least one characteristic value of the subpixel SP. In this implementation, the voltage transferred to the reference voltage line RVL can be a voltage for calculating at least one characteristic value of the subpixel SP or a voltage to which the at least one characteristic value of the subpixel SP is added or counted.

Each of the driving thin film transistor DRT, the scanning thin film transistor SCT, and the sensing thin film transistor SENT included in the display panel 110 can be an n-type transistor or a p-type transistor. Herein, for convenience of description, the driving thin film transistor DRT, the scanning thin film transistor SCT, and the sensing thin film transistor SENT included in the display panel 110 are considered to be n-type transistors.

The storage capacitor Cst can be an external capacitor intentionally designed to be located outside of the driving thin film transistor DRT, other than an internal capacitor, such as a parasitic capacitor (e.g., a Cgs, a Cgd), that can be formed between the gate node and the source node (or the drain node) of the driving thin film transistor DRT.

In one embodiment, the scanning gate line SCL and the sensing gate line SENL can be different gate lines GL from each other. In this embodiment, the scanning gate signal SCAN and the sensing gate signal SENSE can be separate gate signals, and respective turn-on and turn-off times of the scanning thin film transistor SCT and the sensing thin film transistor SENT included in one subpixel SP can be independent of each other. For example, the respective turn-on and turn-off times of the scanning thin film transistor SCT and sensing thin film transistor SENT included in one subpixel SP can be the same as, or different from, each other.

In another embodiment, the scanning gate line SCL and the sensing gate line SENL can be the same gate line GL. For example, the respective gate nodes of the scanning thin film transistor SCT and the sensing thin film transistor SENT included in one subpixel SP can be connected to one gate line GL. In this embodiment, the scanning gate signal SCAN and the sensing gate signal SENSE can be the same gate signal, and respective turn-on and turn-off times of the scanning thin film transistor SCT and the sensing thin film transistor SENT included in one subpixel SP can be the same.

The subpixel structures shown in FIGS. 2 and 3 are merely examples, and can be variously modified by further including one or more thin film transistors or one or more capacitors.

Further, although discussions on the subpixel structures of FIGS. 2 and 3 have been provided based on an example where the display device 100 is a self-emission display device, in an example where the display device 100 is a liquid crystal display, each subpixel SP can include a thin film transistor, a pixel electrode, and the like.

Figure 4:
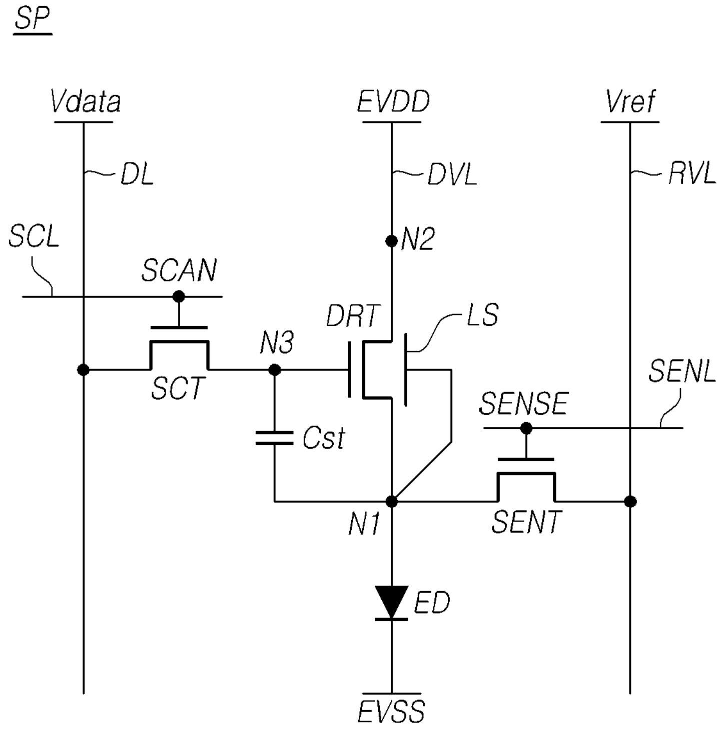
FIG. 4 illustrates an example light shield included in a subpixel of the display device according to aspects of the present disclosure.

FIG. 4 illustrates an example light shield included in a subpixel (e.g., the subpixel of FIG. 3) of the display device 100 according to aspects of the present disclosure.

Referring to FIG. 4, a driving thin film transistor DRT included in a subpixel SP of the display device 100 can have one or more unique electrical characteristics such as a threshold voltage, mobility, and the like. When one or more unique electrical characteristics of the driving thin film transistor DRT vary, the current driving capability (current supplying capability) of the driving thin film transistor DRT can vary, and thereby, light emitting characteristics of the subpixel SP including the driving thin film transistor DRT can also vary.

One or more electrical characteristics (e.g., threshold voltage, mobility, and the like) of the driving thin film transistor DRT can vary as a driving time of the driving thin film transistor DRT increases. In an instance where light is irradiated to the driving thin film transistor DRT, in particular to a channel region of the driving thin film transistor DRT, one or more electrical characteristics (e.g., threshold voltage, mobility, and the like) of the driving thin film transistor DRT can vary.

To address these issues, as shown in FIG. 4, in order to reduce a variance in one or more electrical characteristics (e.g., threshold voltage, mobility, and the like) of the driving thin film transistor DRT, a light shield LS can be disposed around the driving thin film transistor DRT. For example, the light shield LS can be disposed under a channel region of the driving thin film transistor DRT.

The light shield LS can serve as a body of the driving thin film transistor DRT while being located under the channel region of the driving thin film transistor DRT, in addition to serving to shield light.

Thereby, a body effect can occur in the driving thin film transistor DRT. In order to reduce influence of the body effect, the light shield LS serving as the body of the driving thin film transistor DRT can be electrically connected to the first node N1 of the driving thin film transistor DRT. The first node N1 of the driving thin film transistor DRT can be, for example, the source node of the driving thin film transistor DRT.

In one or more embodiments, the light shield LS can be disposed under a respective channel region of one or more other thin film transistors (e.g., SCT and/or SENT), as well as under the channel region of the driving thin film transistor DRT, In one or more embodiments, thin film transistors (DRT, SCT, and/or SENT) can be disposed in each subpixel SP included in the display area DA of the display panel 110. In one or more embodiments where the gate driving circuit 130 is disposed in a non-display area NDA of the display panel 110 using the gate-in-panel (GIP) technique, a plurality of transistors included in the gate driving circuit 130 implemented with the GIP technique can be disposed in the non-display area NDA of the display panel 110.

Figure 5:
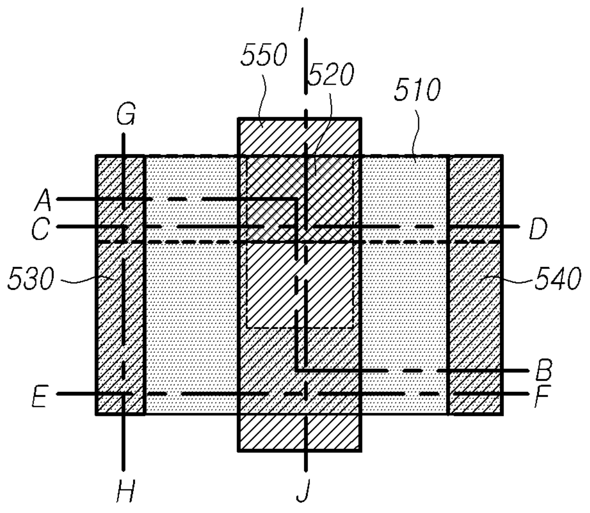
FIG. 5 is a plan view of an example thin film transistor included in the display panel according to aspects of the present disclosure.
Figure 6:
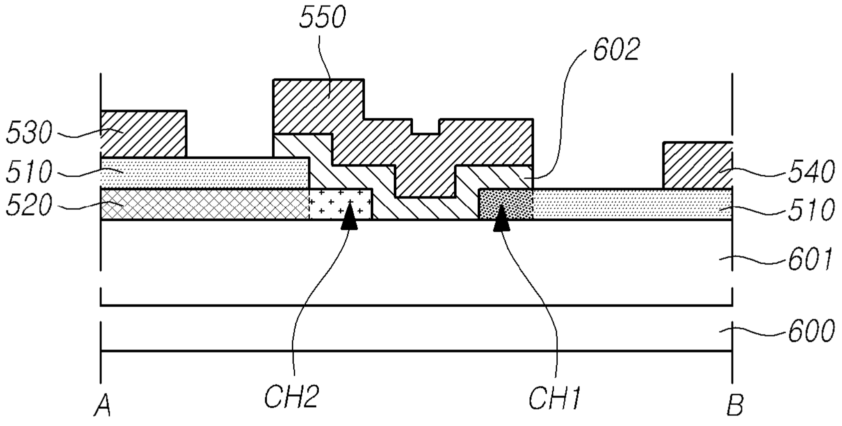
FIG. 6 is an example cross-sectional view taken along with line A-B of FIG. 5.
Figure 7:
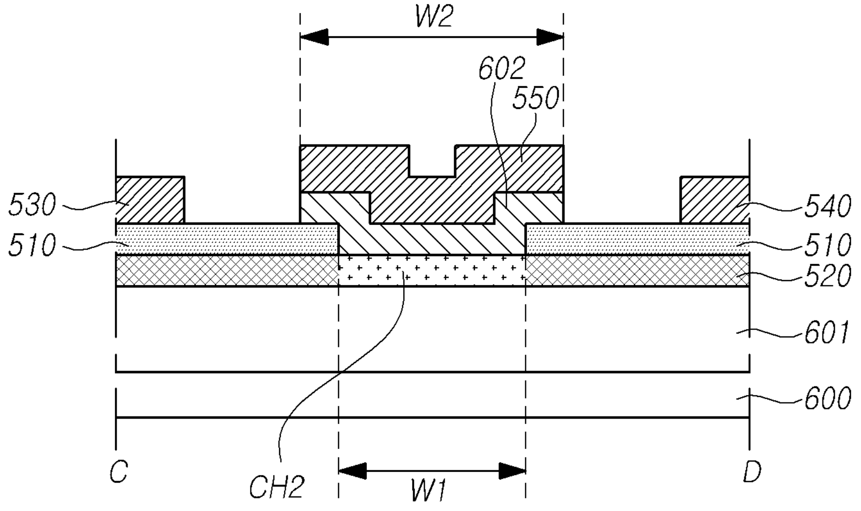
FIGS. 7 and 8 are example cross-sectional views taken along with line C-D of FIG. 5.
Figure 8:
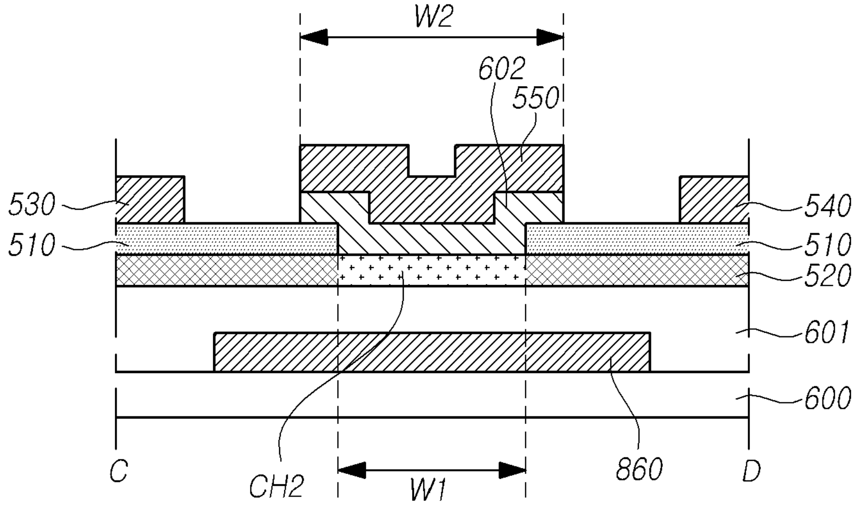
Figure 9:
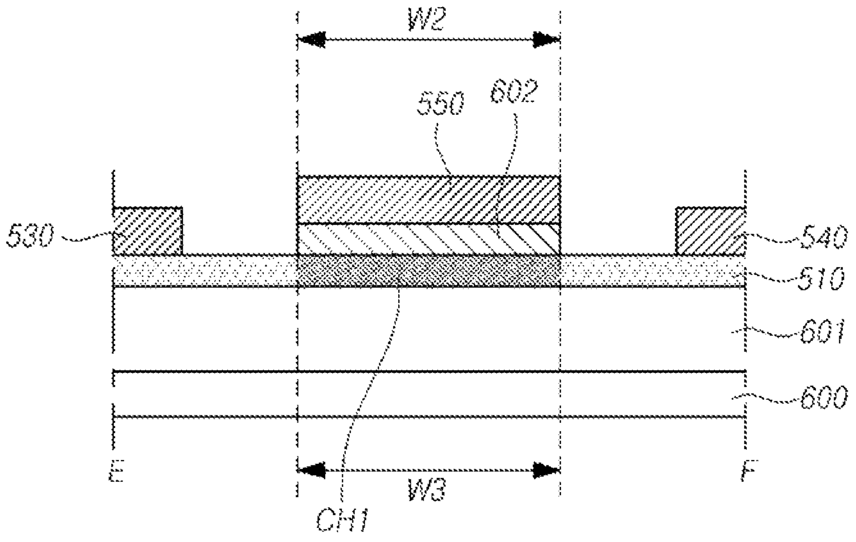
FIGS. 9 and 10 are example cross-sectional views taken along with line E-F of FIG. 5.
Figure 10:
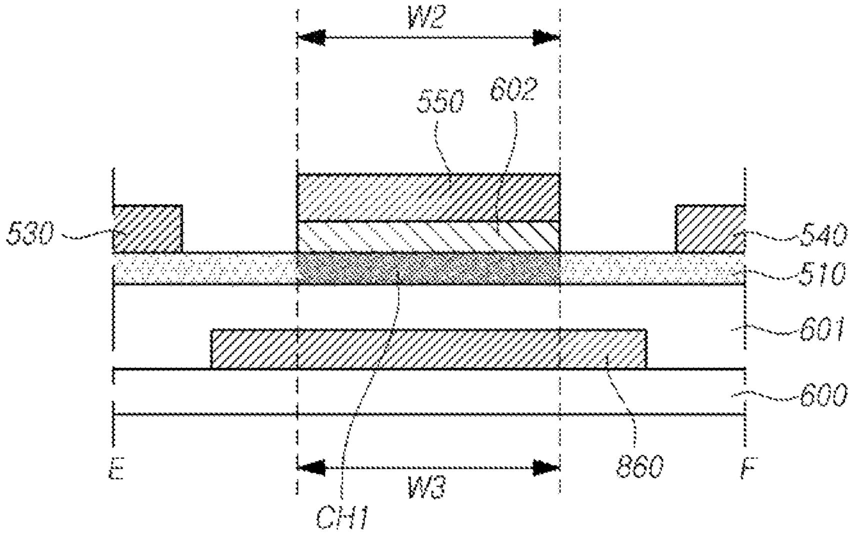
Figure 11:
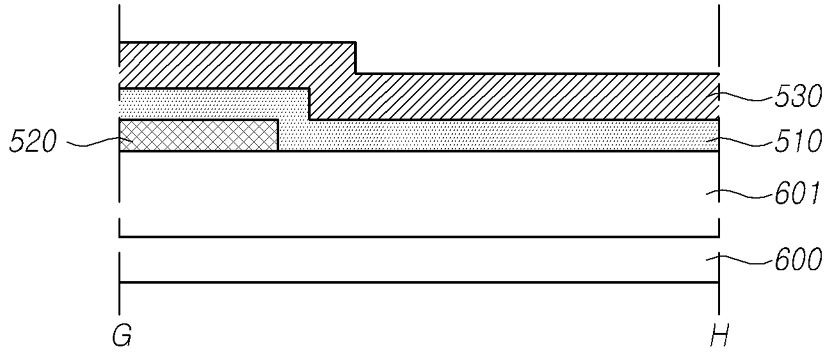
FIG. 11 is an example cross-sectional view taken along with line G-H of FIG. 5.
Figure 12:
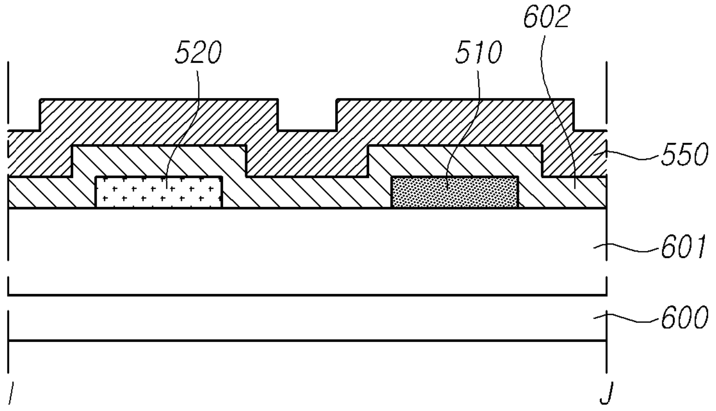
FIG. 12 is an example cross-sectional view taken along with line I-J of FIG. 5.

FIG. 5 is a plan view of an example thin film transistor included in the display panel 110 according to aspects of the present disclosure. FIG. 6 is an example cross-sectional view taken along with line A-B of FIG. 5. FIGS. 7 and 8 are example cross-sectional views taken along with line C-D of FIG. 5. FIGS. 9 and 10 are example cross-sectional views taken along with line E-F of FIG. 5. FIG. 11 is an example cross-sectional view taken along with line G-H of FIG. 5. FIG. 12 is an example cross-sectional view taken along with line I-J of FIG. 5.

In one or more embodiments, the display panel 110 can include a display area DA where one or more images can be displayed and a non-display area NDA different from the display area DA. A plurality of thin film transistors can be disposed in the display area DA and/or the non-display area NDA.

In one or more embodiments, all or at least some of the thin film transistors disposed in the display panel 110 can be thin film transistors (DRT, SCT, and/or SENT) included in each of a plurality subpixels SP disposed in the display area DA of the display panel 110.

In one or more embodiments, all or at least some of the thin film transistors disposed in the display panel 110 can be thin film transistors included in the gate driving circuit implemented with the GIP technique in the non-display area NDA of the display panel 110.

Hereinafter, discussions on thin film transistor structures according to embodiments of the present disclosure are provided based on, as an example thin film transistor, a driving thin film transistor DRT included in each subpixel SP disposed in the display area DA.

Referring to FIGS. 5 and 6, in one or more embodiments, the display panel 110 of the display device 100 can include a substrate 600, a buffer layer 601 on the substrate 600, a first active layer 510 on the buffer layer 601, and a first electrode 530, a second electrode 540, and a third electrode 550 disposed on the first active layer 510.

In one or more embodiments, the display panel 110 according to aspects of present disclosure can include at least one thin film transistor (Tr), and the at least one thin film transistor (Tr) can include the first active layer 510, a second active layer 520, the first electrode 530, the second electrode 540, and the third electrode 550.

In one embodiment, the first electrode 530 can be the source electrode of the thin film transistor (Tr), and the second electrode 540 can be the drain electrode of the thin film transistor (Tr). In another embodiment, the first electrode 530 can be the drain electrode of the thin film transistor (Tr), and the second electrode 540 can be the source electrode of the thin film transistor (Tr). The third electrode 550 can be the gate electrode of the thin film transistor (Tr).

Referring to FIG. 6, the second active layer 520 can be disposed under the first active layer 510. For example, the second active layer 520 can be disposed between the buffer layer 601 and the first active layer 510.

The first active layer 510 can include a first channel region CH1, and the second active layer 520 can include a second channel region CH2.

Each of the first channel region CH1 and the second channel region CH2 can overlap the third electrode 550. The first channel region CH1 and the second channel region CH2 may not overlap each other.

The first active layer 510 and the second active layer 520 can include an oxide semiconductor material. The first active layer 510 and the second active layer 520 can include different oxide semiconductor materials. The oxide semiconductor material can be a semiconductor material obtained by controlling conductivity and adjusting a bandgap through doping of an oxide material, and can generally be a transparent semiconductor material having a wide bandgap.

For example, each of the first active layer 510 and the second active layer 520 can include at least one of Indium Zinc Oxide (IZO), Thin Transparent W-Doped Indium-ZincOxide (WIZO), Indium Gallium Zinc Oxide (IGZO), Indium Tin Zinc Oxide (ITZO), Indium Gallium Tin Zinc Oxide (IGTZO), Zinc Oxide Nitride (ZnON), and Indium Gallium Oxide (IGO); however, embodiments of the present disclosure are not limited thereto. For example, any oxide semiconductor material capable of enabling each of the first active layer 510 and the second active layer 520 to have high mobility can be included in the first active layer 510 and the second active layer 520. In these examples, respective mobility of the first active layer 510 and the second active layer 520 can be different from each other.

In one embodiment, the first active layer 510 can include indium zinc oxide (IZO), and the second active layer 520 can include indium gallium zinc oxide (IGZO); however, embodiments of the present disclosure are not limited thereto.

In an example where the first active layer 510 and the second active layer 520 include indium zinc oxide (IZO) and indium gallium zinc oxide (IGZO), respectively, the indium content of the indium zinc oxide (IZO) can be 50% to 70%, and the indium content of the indium gallium zinc oxide (IGZO) can be 75% or more and less than 100%. In this manner, oxide semiconductor materials having high mobility can be implemented by adjusting respective indium contents of such oxide semiconductor materials.

When one or more active layers include an oxide semiconductor material as discussed above, a thin film transistor including the one or more active layers can be referred to as an oxide thin film transistor.

Referring to FIG. 6, a gate insulating layer 602 can be disposed on the first and second active layers 510 and 520. The gate insulating layer 602 can be disposed in respective portions of upper surfaces of the first and second active layers 510 and 520.

The gate insulating layer 602 can be disposed on a portion of the first active layer overlapping the second active layer 520, on a portion of the second active layer 520 not overlapping the first active layer 510, and in a portion of an area not overlapping the first active layer 510 among an area located under the first active layer 510.

The gate insulating layer 602 can overlap the first channel region CH1 of the first active layer 510 and the second channel region CH2 of the second active layer 520.

The first electrode 530, the second electrode 540, and the third electrode 550 can be disposed on the first and second active layers 510 and 520.

The first channel region CH1 of the first active layer 510 and the second channel region CH2 of the second active layer 520 can overlap a gate electrode (e.g., the third electrode 550). An area of the first active layer 510 disposed around the second channel region CH2 on the second active layer 520 and overlapping the third electrode 550 can be at least a portion of the remaining area of the first active layer 510 except for the first channel region CH1.

Although FIGS. 5 and 6 illustrate the structure in which the third electrode 550 serving as the gate electrode is disposed on the first and second active layers 510 and 520, but embodiments of the present disclosure are not limited thereto. For example, the third electrode 550 can be disposed under the first and second active layers 510 and 520.

Further, although FIGS. 5 and 6 illustrate the structure in which the gate insulating layer 602 is disposed only under the third electrode 550, but embodiments of the present disclosure are not limited thereto. For example, the gate insulating layer 602 can also be disposed in at least a portion of the remaining area except for areas where the first and second electrodes 530 and 540 contact the first active layer 510.

Referring to FIGS. 5 and 6, the first electrode 530, the second electrode 540, and the third electrode 550 can be spaced apart from each other.

In one or more embodiments, referring to FIG. 6, the first electrode 530 and the second electrode 540 can be disposed to contact respective portions of the upper surface of the first active layer 510.

The third electrode 550 can be disposed on the gate insulating layer 602.

Each of the first electrode 530, the second electrode 540, and the third electrode can be configured with a single layer or a multilayer. For example, each of the first electrode 530, the second electrode 540, and the third electrode 550 can be configured with a single layer including copper (Cu), aluminum (Al), molybdenum (Mo), titanium (Ti), molybdenum-titanium (MoTi), and/or the like.

In an example where at least one of the first electrode 530, the second electrode 540, and the third electrode 550 is configured with a multilayer, at least one of the first, second and third electrodes (530, 540, and/or 550) can include a respective lower electrode and a respective upper electrode electrically connected to each other.

The lower electrode can include a first metal, and the upper electrode can include a second metal different from the first metal. For example, the first metal can include molybdenum (Mo), titanium (Ti), molybdenum-titanium (MoTi), or the like, and the second metal can include copper (Cu), aluminum (Al), or the like. However, the embodiments of the present disclosure are not limited thereto.

As shown in FIGS. 5 and 6, each of the first electrode 530 and the second electrode 540 can be disposed in respective portions of the first active layer 510, for example, in respective portions of the upper surface of the first active layer 510 and electrically connected to the first active layer 510.

In one or more embodiments, each of the first and second electrodes 530 and 540 can overlap both the first and second active layers 510 and 520 in a partial area, and/or can overlap only the first active layer 510 in another partial area.

For example, as shown in FIG. 5, the second active layer 520 disposed under the first active layer 510 can overlap the first active layer 510 in the remaining area except for the second channel area CH2.

In one or more embodiments, the display device 100 according to aspects of the present disclosure can include at least one thin film transistor including one or more first active layers 510, one or more second active layers 520, one first electrode 530, one second electrode 540, and one third electrode 550.

The at least one thin film transistor can have a structure in which the first active layer 510 and the second active layer 520, which have respective channel regions located in different areas, share one first electrode 530, one second electrode 540, and one third electrode 550.

In an example where the first active layer 510 includes indium zinc oxide (IZO), electron mobility of the thin film transistor can be increased as the first active layer 510 is electrically connected to the indium zinc oxide (IZO). Accordingly, there can be provided an effect of reducing the power consumption of the display device 100.

In an example where the second active layer 520 includes indium gallium zinc oxide (IGZO), the on-current of the thin film transistor can be increased, and the reliability of the thin film transistor can be improved. In other words, thin film transistors according to embodiments of the present disclosure can have high electron mobility and improved reliability.

Referring to FIGS. 7 and 8, the second active layer 520 can have the second channel region CH2 in an area where the second active layer 520 does not overlap the first active layer 510.

The gate insulating layer 602 can be disposed on the second channel region CH2 of the second active layer 520 and a portion of the first active layer 510. The first active layer 510 overlapping the gate insulating layer 602 can be disposed such that the first active layer 510 surrounds the second channel region CH2.

A first width W1 of the second channel region CH2 can be different from a second width W2 of the gate insulating layer 602. For example, as shown in FIGS. 7 and 8, the first width W1 can be smaller than or equal to the second width W2.

The first width W1 of the second channel region CH2 of the second active layer can be determined according to a location of the first active layer 510. For example, as an area where the first active layer 510 disposed on the second active layer 520 overlaps the gate insulating layer 602 increases, the first width W1 of the second channel region CH2 can decrease. In another example, as an area where the first active layer 510 disposed on the second active layer 520 overlaps the gate insulating layer 602 decreases, the first width W1 of the second channel region CH2 can increase.

In this manner, the first width W1 of the second channel region CH2 of the second active layer 520 can be adjusted by adjusting an overlapping area between the first active layer and the gate insulating layer 602, this enabling the second active layer 520 to have a short channel region more effectively without a separate process.

Referring to FIGS. 9 and 10, the gate insulating layer 602 can be disposed on the first channel region CH1 of the first active layer 510.

A first width W3 of the first channel region CH1 can be the same as the second width W2 of the gate insulating layer 602. Although FIGS. 9 and 10 illustrate the structure in which the second width W2 and the third width W3 are the same, but embodiments of the present disclosure are not limited thereto. For example, the second width W2 can be smaller than the third width W3.

During the process of performing dry etching for the gate insulating layer material for forming the gate insulating layer 602 disposed on the first active layer 510, the first active layer can become partially conductive, and an area of the first active layer 510 corresponding to an area where the gate insulating film 602 is finally disposed may not become conductive because plasma does not have an effect on this area.

However, an area where the first active layer 510 becomes conductive can vary according to dry etching process conditions.

The first width W1, the second width W2, and the third width W3 described above can refer to respective minimum lengths in a direction perpendicular to a direction in which the gate insulating layer 602 is stacked on the first active layer 510.

Although FIGS. 7 and 9 illustrate the structure in which the buffer layer 601 and the substrate 600 are disposed under the first active layer 510 or the second active layer 520, but structures according to the embodiments of the present disclosure are not limited thereto.

For example, as illustrated in FIGS. 8 and 10, at least one light shield 860 can be further disposed such that the at least one light shield 860 corresponds to areas where the first and second channel regions CH1 and CH2 are disposed.

The entire area of the first and second channel regions CH1 and CH2 can overlap the light shield 860. In this manner, one or more characteristics of one or more thin film transistor due to the irradiation of light to the first and second channel regions CH1 and CH2 can be prevented from being reduced.

Referring to FIG. 11, the first active layer 510 can be disposed under the first electrode 530.

The second active layer 520 can be disposed under the first active layer 510. A portion of the second active layer 520 can overlap a portion of the first active layer 510.

The buffer layer 601 and the substrate 600 can be disposed under the first active layer 510.

Referring to FIGS. 5 and 11, the first electrode 530 can be disposed in a portion of an area where the first active layer 510 and the second active layer 520 overlap each other, and can also be disposed in a portion of an area in which the first active layer 510 does not overlap the second active layer 520.

Although FIG. 11 illustrates the structure in which the first active layer 510 and the second active layer 520 are disposed under the first electrode 530, but embodiments of the present disclosure are not limited thereto. For example, the elements disposed, and the structure formed, under the first electrode 530 can be substantially equally applied or formed under the second electrode 540.

Referring to FIG. 12, the gate insulating layer 602 can be disposed under the third electrode 550. The first active layer 510 and the second active layer 520 can be spaced apart from each other under the gate insulating layer 602.

The first active layer 510 and the second active layer 520 shown in FIG. 12 can be areas corresponding to the first and second channel regions CH1 and CH2 among respective areas of the first and second active layers 510 and 520, respectively.

Referring to FIG. 12, the buffer layer 601 and the substrate 600 can be disposed under the first active layer 510 and the second active layer 520.

Hereinafter, the process of manufacturing the thin film transistor shown in FIGS. and 6 will be discussed.

FIGS. 13 to 17 illustrate an example process of manufacturing the thin film transistor shown in FIGS. 5 and 6 according to aspects of the present disclosure.

Figure 13:
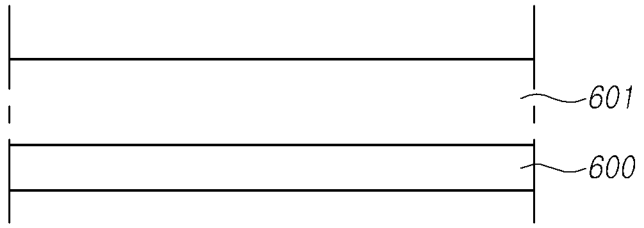
FIGS. 13 to 17 illustrate an example process of manufacturing the thin film transistor shown in FIGS. 5 and 6 according to aspects of the present disclosure.

Referring to FIG. 13, the buffer layer 601 can be disposed on the substrate 600.

Figure 14:
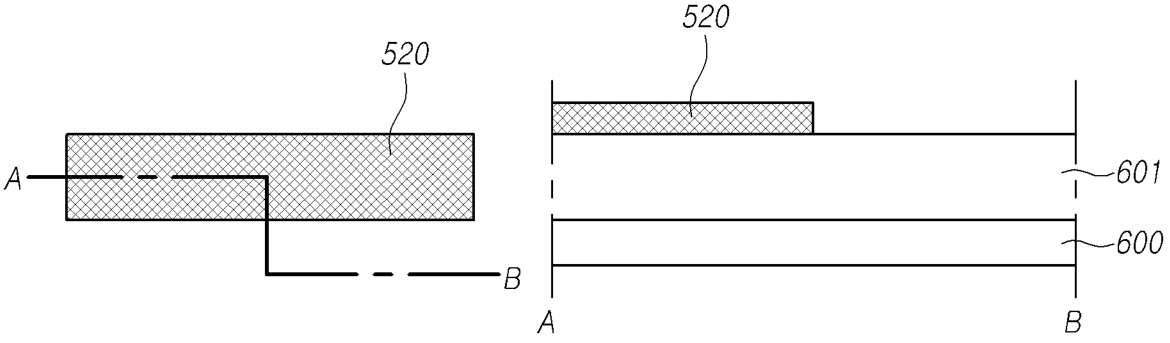

Referring to FIG. 14, the second active layer 520 can be disposed in a portion of the upper surface of the buffer layer 601.

A material of the second active layer can be formed on the buffer layer 601, and the second active layer 520 can be formed such that a portion of the upper surface of the buffer layer 601 is exposed through a patterning process using a mask.

Figure 15:
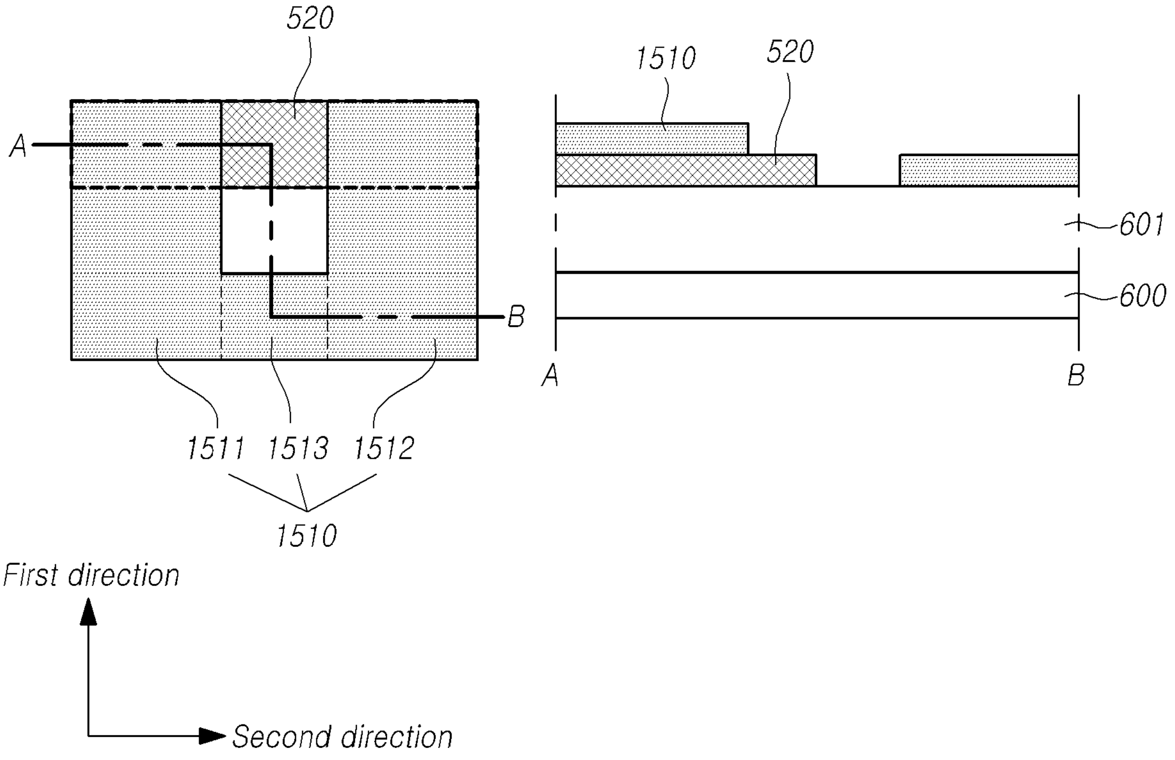

Referring to FIG. 15, a first active layer pattern 1510 can be disposed on the buffer layer 601 on which the second active layer 520 is formed.

The first active layer pattern 1510 can be disposed such that a portion of the upper surface of the second active layer 520 is exposed. In other words, as illustrated in FIG. 15, a portion of the first active layer pattern 1510 can disposed on a portion of the second active layer 520.

For example, as shown in FIG. 15, the first active layer pattern 1510 can be formed in a '⊏' shape, and at least a portion of the first active layer pattern 1510 can be spaced apart from the second active layer 520.

Meanwhile, in FIG. 15, an area of the second active layer 520 not overlapping the first active layer pattern 1510 can be a portion to be developed as the second channel region CH2 of the second active layer 520.

Referring to FIG. 15, the first active layer pattern 1510 can include a first portion extending in a first direction and partially overlapping the second active layer 520, a second portion 1512 extending in the first direction, partially overlapping the second active layer 520, and spaced apart from the first portion 1511, and a third portion 1513 extending in a second direction crossing the first direction, disposed between the first portion 1511 and the second portion 1512, and not overlapping the second active layer 520. Alternatively, the third portion 1513 can overlap the second active layer 520.

The third portion 1513 can be a portion including the first channel region CH1 of the first active layer 510 to be formed in a later process.

Although FIG. 15 illustrates that the portion to be developed as the second channel region CH2 of the second active layer 520 and the third portion 1513, which is the portion to be developed as the first channel region CH1 of the first active layer 510, are spaced apart from each other, in one or more embodiments, a side surface of the portion to be developed as the second channel region CH2 and a side surface of the third portion 1513 can contact each other.

For example, the third portion 1513 can extend in the second direction and contact the portion to be developed as the second channel region CH2 of the second active layer 520. In this manner, a size of the third portion 1513 can be changed according to characteristics required for a corresponding thin film transistor (TR).

In another example, the second active layer 520 can extend in the second direction and contact the portion to be developed as the first channel region CH1 of the first active layer 510.

Figure 16:
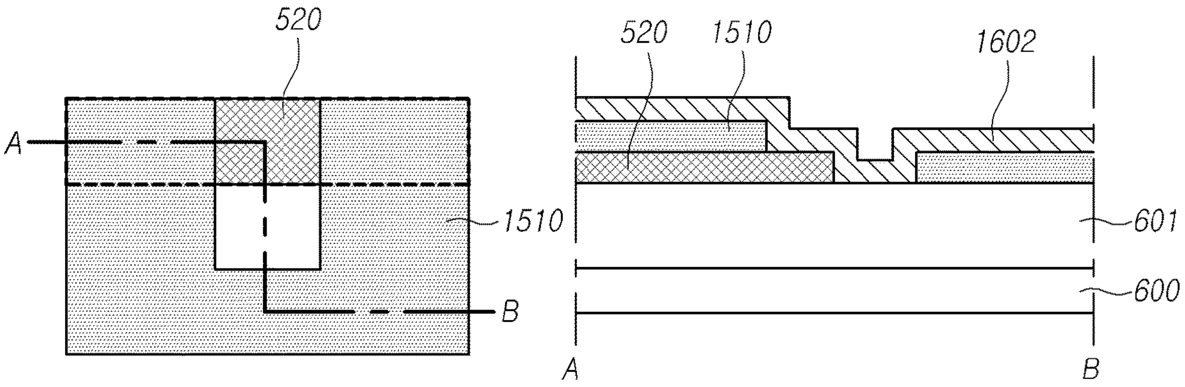

Referring to FIG. 16, a gate insulating layer material 1602 can be disposed on the substrate 600 on which the second active layer 520 and the first active layer pattern 1510 are disposed. Thereafter, an electrode material can be disposed on the gate insulating layer material 1602.

Figure 17:
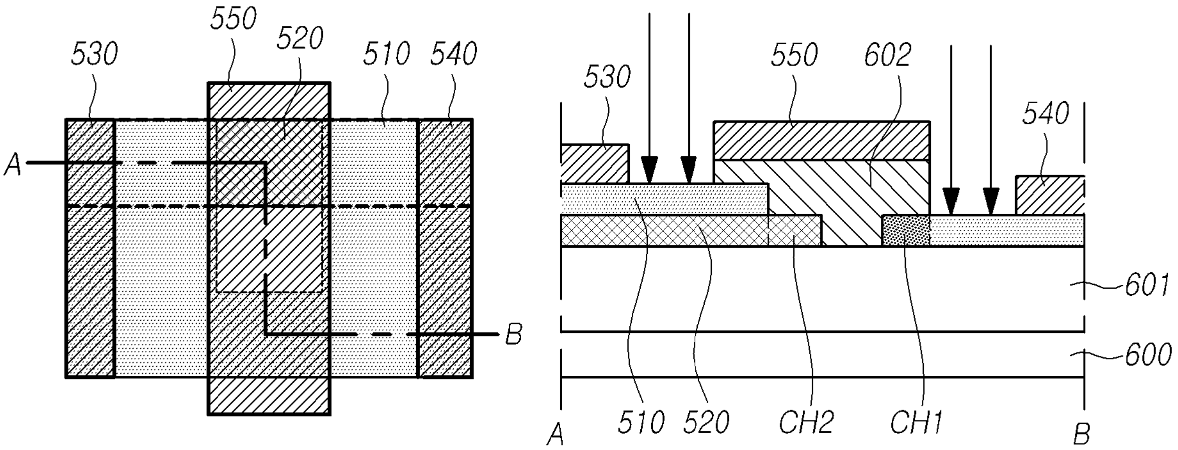

As shown in FIG. 17, the first electrode 530, the second electrode 540, and the third electrode 550 can be formed by patterning the electrode material through a mask process.

Thereafter, as illustrated in FIG. 17, the gate insulating layer material 1602 can be patterned through a dry etching process using the first to third electrodes (530, 540, and 550) as masks, and thereby, the gate insulating layer 602 exposing a portion of the upper surface of the first active layer pattern can be formed.

In the dry etching process, the first active layer pattern located in an area where the first to third electrodes (530, 540, and 550) and the gate insulating layer 602 are not disposed can become conductive by plasma, and thereby, the first active layer 510 can be formed. For example, an area of the first active layer 510 except for areas overlapping the first electrode 530, the second electrode 540, and the third electrode 550 can be a conductivity-enabled area. The first electrode 530 can be disposed on a portion of the first portion 1511. The second electrode 540 can be disposed on a portion of the second portion 1512. Each of the first electrode 530 and the second electrode 540 can overlap an area of the first active layer 510 disposed on the second active layer and a portion of an area of the first active layer 510 not overlapping the second active layer 520. The third electrode 550 can overlap the third portion 1513 of the first active layer 510. The first channel region CH1 of the first active layer 510 can overlap the second active layer CH2, and the second channel region CH2 of the second active layer 520 may not overlap the first active layer 510. Alternatively, the entirety of each of the first electrode 530 and the second electrode 540 can overlap the first active layer 510 and the second active layer 520.

A portion of the first active layer 510 disposed in an area where the first to third electrodes (530, 540, and 550) and the gate insulating layer 602 remain may not become conductive. In other words, among an area of the first active layer 510, an area disposed under the first to third electrodes (530, 540, and 550) and the gate insulating layer 602 may not become conductive.

Since the gate insulating layer 602 or the first active layer 510 is disposed on the second active layer 520, the second active layer 520 may not become conductive during the process of forming the gate insulating layer 602.

An area of the first active layer 510 overlapping the gate insulating layer 602 can include the first channel region CH1, and an area of the second active layer 520 overlapping the gate insulating layer 602 can include the second channel region CH2.

The thin film transistor formed through the process discussed above can include two channel regions per thin film transistor, and the two channel regions can be connected in parallel. Further, the channel regions (first and second channel regions) can include different materials.

Through this structure, the thin film transistor according to the embodiments of the present disclosure can have characteristics of high electron mobility and improved reliability.

Figure 18:
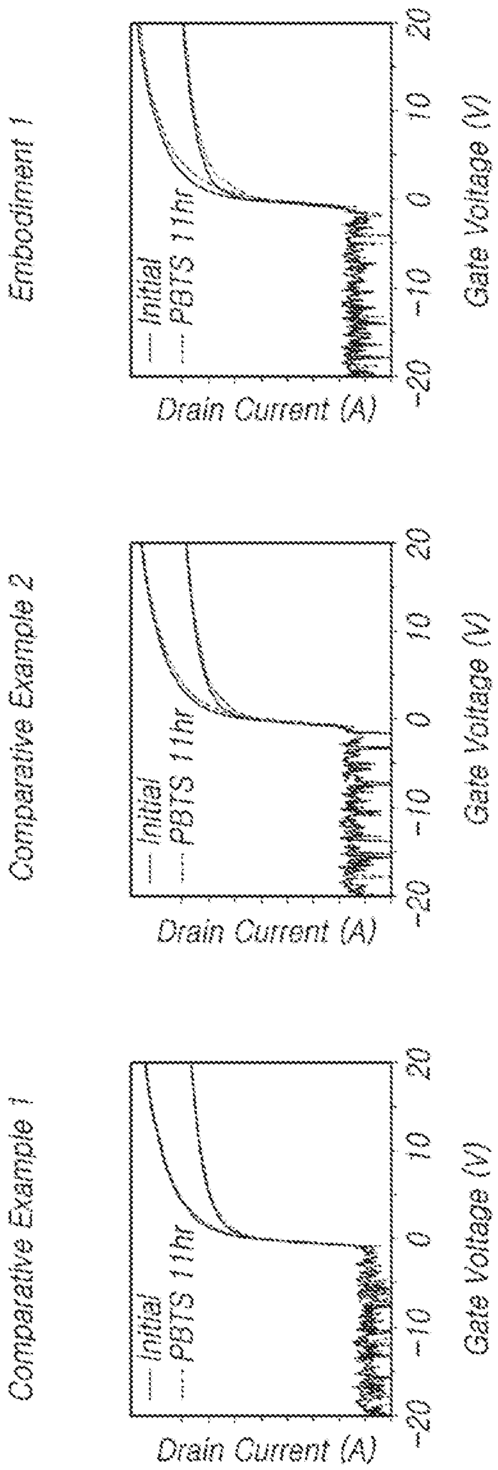
FIGS. 18 and 19 illustrate example electrical characteristics of thin film transistors according to Comparative Example 1, Comparative Example 2, and Embodiment 1 of the present disclosure.
Figure 19:
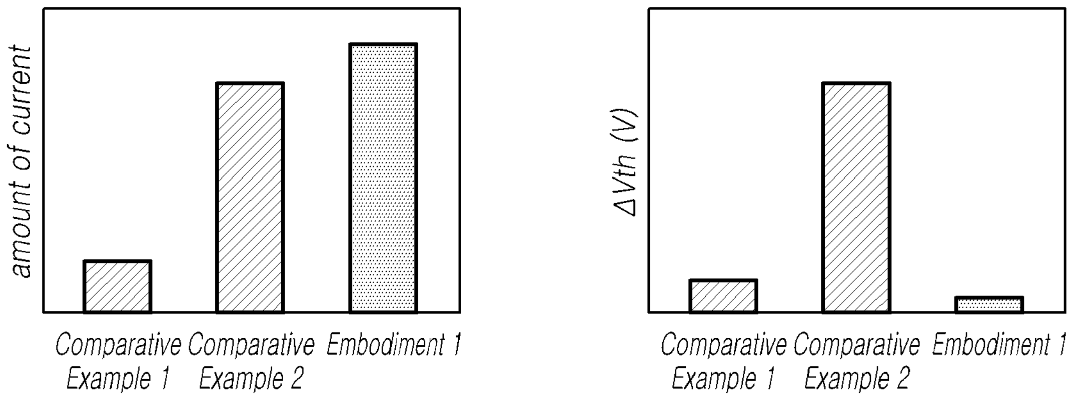

FIGS. 18 and 19 illustrate example electrical characteristics of thin film transistors according to Comparative Example 1, Comparative Example 2, and Embodiment 1 of the present disclosure.

A thin film transistor of Comparative Example 1 of FIGS. 18 and 19 can be a typical thin film transistor including one active layer including indium gallium zinc oxide (IGZO) and first to third electrodes disposed on the active layer. A thin film transistor of Comparative Example 2 can be a typical thin film transistor including one active layer including indium zinc oxide (IZO) and first to third electrodes disposed on the active layer. A thin film transistor of Embodiment 1 can represent the thin film transistor of FIG. 5 discussed above.

FIG. 18 shows graphs (in the condition of positive bias temperature stress for 11 hours (PBTS 11 hr)) of gate voltage versus drain current of the thin film transistors according to Comparative Example 1, Comparative Example 2, and Embodiment 1. FIG. 19 is graphs (in the condition of positive bias temperature stress for 11 hours) of an amount of current of each thin film transistor and an amount of threshold voltage (Vth) changes ΔVth of each thin film transistor according to an area of a first channel region of a respective first active layer and an area of a second channel region of a respective second active layer.

As illustrated in FIGS. 18 and 19, the thin film transistor according to Comparative Example 1 has a high reliability characteristic, but may not be suitable for a low power consumption display device because of a low on-current characteristic and a low amount of current.

The thin film transistor according to Comparative Example 2 produces a high amount of current, but may not be suitable for a display device requiring high performance because of low reliability.

In contrast, the thin film transistor according to Embodiment 1 has a high on-current characteristic, high reliability, and a high current producing characteristic, and therefore, can be suitable for a display device of high performance and high capability. In addition, the thin film transistor according to Embodiment 1 can be applied to, in particular, a low power consumption display panel requiring high reliability and a high mobility characteristic (a high amount of current).

Meanwhile, in the discussions related to FIG. 15, it has been described that the size of the first active layer 510 or the second active layer 520 can be changed. Hereinafter, thin film transistor characteristics according to respective areas of channel regions of the first active layer 510 and the second active layer 520 will be discussed with reference to FIGS. 20 and 21.

Figure 20:
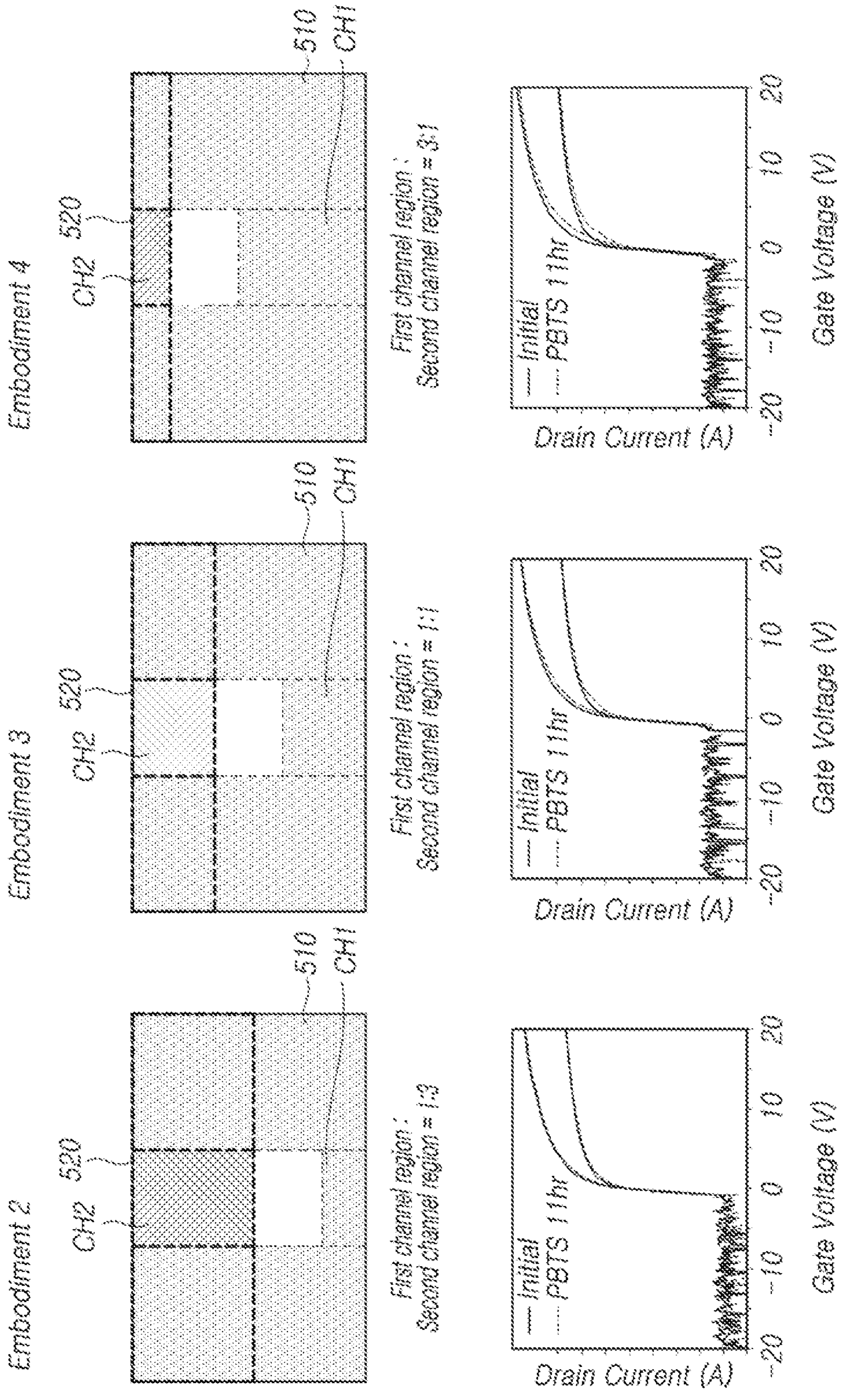
FIG. 20 illustrates example graphs (in the condition of positive bias temperature stress for 11 hours) of gate voltage versus drain current of thin film transistors according to an area of a first channel region of a respective first active layer and an area of a second channel region of a respective second active layer according to aspects of the present disclosure.
Figure 21:
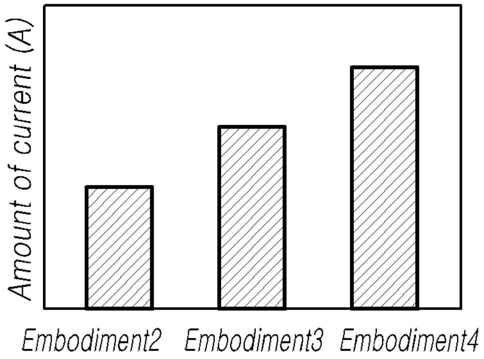
FIG. 21 is an example graph showing amounts of current of thin film transistors according to an area of a first channel region of a respective first active layer and an area of a second channel region of a respective second active layer according to aspects of the present disclosure.

FIG. 20 shows example graphs (in the condition of positive bias temperature stress for 11 hours) of gate voltage versus drain current of thin film transistors according to an area of a first channel region of a respective first active layer and an area of a second channel region of a respective second active layer. FIG. 21 is an example graph showing amounts of current of the thin film transistors of FIG. 20.

Referring to FIGS. 20 and 21 along with FIGS. 15 to 17, a thin film transistor according to Embodiment 2 can have a structure in which an area of the first channel region CH1 of the first active layer 510 is ⅓ of an area of the second channel region CH2 of the second active layer 520 (for example, the ratio of the area of the first channel region CH1 to the area of the second channel region CH2 is 1:3). A thin film transistor according to Embodiment 3 can have another structure in which an area of the first channel region CH1 of the first active layer 510 is equal to an area of the second channel region CH2 of the second active layer 520 (for example, the ratio of the area of the first channel region CH1 to the area of the second channel region CH2 is 1:1). A thin film transistor according to Embodiment 4 can have further another structure in which an area of the first channel region CH1 of the first active layer 510 is three times an area of the second channel region CH2 of the second active layer 520 (for example, the ratio of the area of the first channel region CH1 to the area of the second channel region CH2 is 3:1).

Referring to FIG. 21, as the area of the first channel region CH1 increases, an amount of current increases, but as shown in FIG. 20, it can be seen that the probability of causing degradation to occur due to bias stress increases.

For example, when a hump phenomenon observed as if one transistor had two threshold voltages in the graph of gate voltage versus drain current is caused, the stability of such a thin film transistor can be reduced.

The structure of the thin film transistor of Embodiment 3 shown in FIGS. 20 and 21 can be the same as the structure of the thin film transistor of Embodiment 1 shown in FIGS. 18 and 19.

When comparing the graphs of gate voltage versus drain current of the thin film transistors according to Embodiment 2 to 4 shown in FIG. 20 with the graph of gate voltage versus drain current of the thin film transistor according to Comparative Example 2 shown in FIG. 18, it can be seen that the hump phenomenon does not occur in the thin film transistors of Embodiment to 4, but the hump phenomenon occurs in the thin film transistor of Comparative Example 2. Therefore, while the thin film transistors according to Embodiment 2 to 4 can have high reliability, the thin film transistor of Comparative Example 2 can have low reliability.

When comparing the amounts of current of the thin film transistors according to Embodiments 2 to 4 shown in FIG. 21 and the amount of current of the thin film transistor according to Comparative Example 1 shown in FIG. 19, it can be seen that the amounts of current of the thin film transistors according to Embodiments 2 to 4 is higher than the amount of current of the thin film transistor according to Comparative Example 1 shown in FIG. 19.

As such, when a thin film transistor includes one active layer including one type of oxide semiconductor material (e.g., the thin film transistors of Comparative Example 1 and Comparative Example 2), the thin film transistor can have characteristics such that while the reliability of the thin film transistor is relatively high, the amount of current thereof is relatively low, or while the reliability is relatively low, the amount of current is relatively high.

In other words, typical thin film transistors such as Comparative Example 1 and Comparative Example 2 may not be allowed to have both high reliability and high current producing characteristics.

In contrast, the thin film transistors according to the embodiments of the present disclosure can have both high reliability and high current producing characteristics by including the first active layer 510 and the second active layer 520 including different oxide semiconductor materials.

In particular, referring to FIGS. 20 and 21, the ratio of the area of the first channel region CH1 of the first active layer 510 to the area of the second channel region CH2 of the second active layer 520 can be 1:3 to 3:1.

In an example where an area of the second channel region CH2 exceeds three times an area of the first channel region CH1, the current producing characteristic of a corresponding thin film transistor can be reduced, and as a result, when such a thin film transistor is applied to a display device, power consumption can increase.

In an example where an area of the second channel region CH2 is less than ⅓ of area of the first channel region CH1, the hump phenomenon can occur and the reliability of the thin film transistor can be reduced.

Thin film transistors according to embodiments of the present disclosure can be used as various thin film transistors applied to the display device 100.

For example, the thin film transistors according to the embodiments described above can be used as driving thin film transistors, which is described with reference to FIG. 22 as follows.

Figure 22:
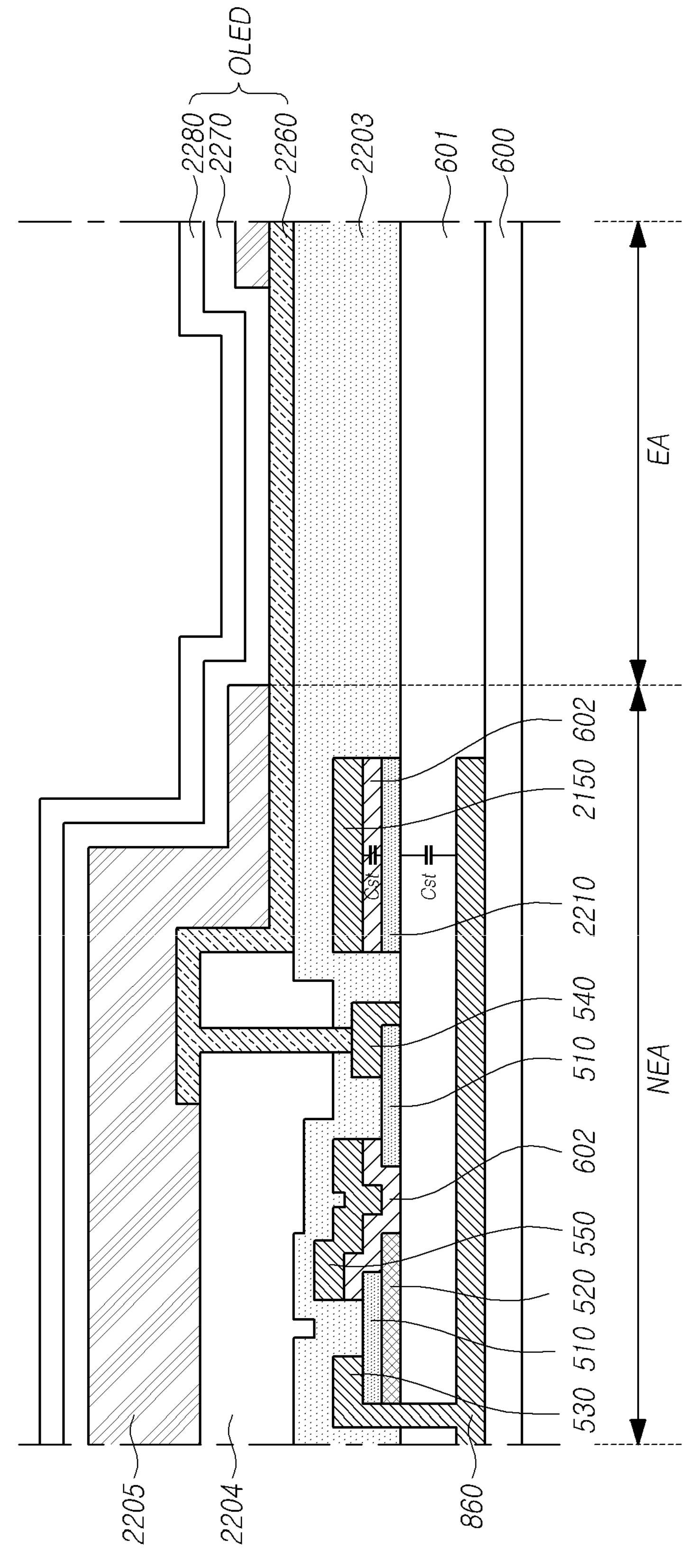
FIG. 22 is an example cross-sectional view illustrating a structure in which a thin film transistor is electrically connected to an organic light emitting element (e.g., an OLED) in the display device according to aspects of the present disclosure.

FIG. 22 is an example cross-sectional view illustrating a structure in which a thin film transistor is electrically connected to an organic light emitting element (e.g., an OLED) in the display device 100 according to aspects of the present disclosure.

In the following description, some configurations, effects, etc., of the embodiments or examples discussed above may not be repeatedly described for convenience of description. It should be, however, understood that the scope of the present disclosure includes such omitted configurations already discussed above. Further, in the following description, like reference numerals will be used for configurations or elements equal to, or substantially or nearly equal to, those of embodiments or examples described above.

Referring to FIG. 22, a thin film transistor TR (see FIG. 23), a storage capacitor Cst, and an organic light emitting element OLED can be disposed on a substrate 600.

Specifically, a light shield 860 can be disposed on the substrate 600. A buffer layer can be disposed on the light shield 860.

A first active layer 510, a second active layer 520, and a first storage capacitor electrode 2210 can be disposed on the buffer layer 601. The first storage capacitor electrode 2210 can be disposed on a same layer as the first active layer 510.

Referring to FIG. 22, a portion of the first active layer 510 can be disposed on a portion of the upper surface of the buffer layer 601, and another portion of the first active layer can be disposed on the second active layer 520.

The first storage capacitor electrode 2210 can be disposed on a portion of the upper surface of the buffer layer 601 and can include the same material as that of the first active layer 510.

A gate insulating layer 602 can be disposed on a portion of the upper surface of the first active layer 510, a portion of the upper surface of the second active layer 520, and the first storage capacitor electrode 2210.

A first electrode 530, a second electrode 540, a third electrode 550, and a second storage capacitor electrode 2150 can be disposed on the substrate 600 on which the gate insulating layer 602 is disposed. The second storage capacitor electrode 2150 can be disposed on a same layer as the first to third electrodes 530, 540 and 550.

The first electrode 530 can contact a portion of the upper surface of the first active layer 510 disposed on the second active layer 520. The first electrode 530 can be electrically connected to the light shield 860 through a contact hole formed in the buffer layer 601.

Here, not only the first storage capacitor electrode 2210 and the second storage capacitor electrode 2150, but also the light shield 860 can also serve as a storage capacitor electrode, and thereby, double storage capacitors Cst can be formed.

A passivation layer 2203 can be disposed on the substrate 600 on which the first electrode 530, the second electrode 540, the third electrode 550, and the second storage capacitor electrode 2150 are disposed.

An overcoat layer 2204 can be disposed on the passivation layer 2203. The overcoat layer 2204 can be disposed in a portion of a non-light emitting area NEA and may not be disposed in a light emitting area EA, but embodiments of the present disclosure are not limited thereto. For example, the overcoat layer 2204 can also be disposed in at least a portion of the light emitting area EA.

An anode electrode 2260 of the organic light emitting element OLED can be disposed on the overcoat layer 2204 and the passivation layer 2203.

A bank 2205 defining the light emitting area EA and the non-light emitting area NEA can be disposed on a portion of the upper surface of the anode electrode 2260 and the overcoat layer 2204. An area where the bank 2205 is disposed can be the non-light emitting area NEA, and an area where the bank 2205 is not disposed can be the light emitting area EA.

The anode electrode 2260 can be electrically connected to the second electrode of the thin film transistor disposed in the non-light emitting area NEA through contact holes formed in the overcoat layer 2204 and the passivation layer 2203.

An emission layer 2270 of the organic light emitting element OLED can be disposed on the bank 2205 and the anode electrode 2260, and a cathode electrode 2280 of the organic light emitting element OLED can be disposed on the emission layer 2270.

In one or more embodiments, one of the anode electrode 2260 and the cathode electrode 2280 can include a reflective electrode, but embodiments of the present disclosure are not limited thereto. For example, both the anode electrode 2260 and the cathode electrode 2280 may not include a reflective electrode.

In one or more embodiments, at least one of the anode electrode 2260 and the cathode electrode 2280 can be configured with a multilayer, but embodiments of the present disclosure are not limited thereto.

In one or more embodiments, thin film transistors can have a structure in which a plurality of first channel regions CH1 of the first active layer 510 and a plurality of second channel regions CH2 of the second active layer 520 are alternately disposed.

Such a structure is further discussed with reference to FIG. 23.

Figure 23:
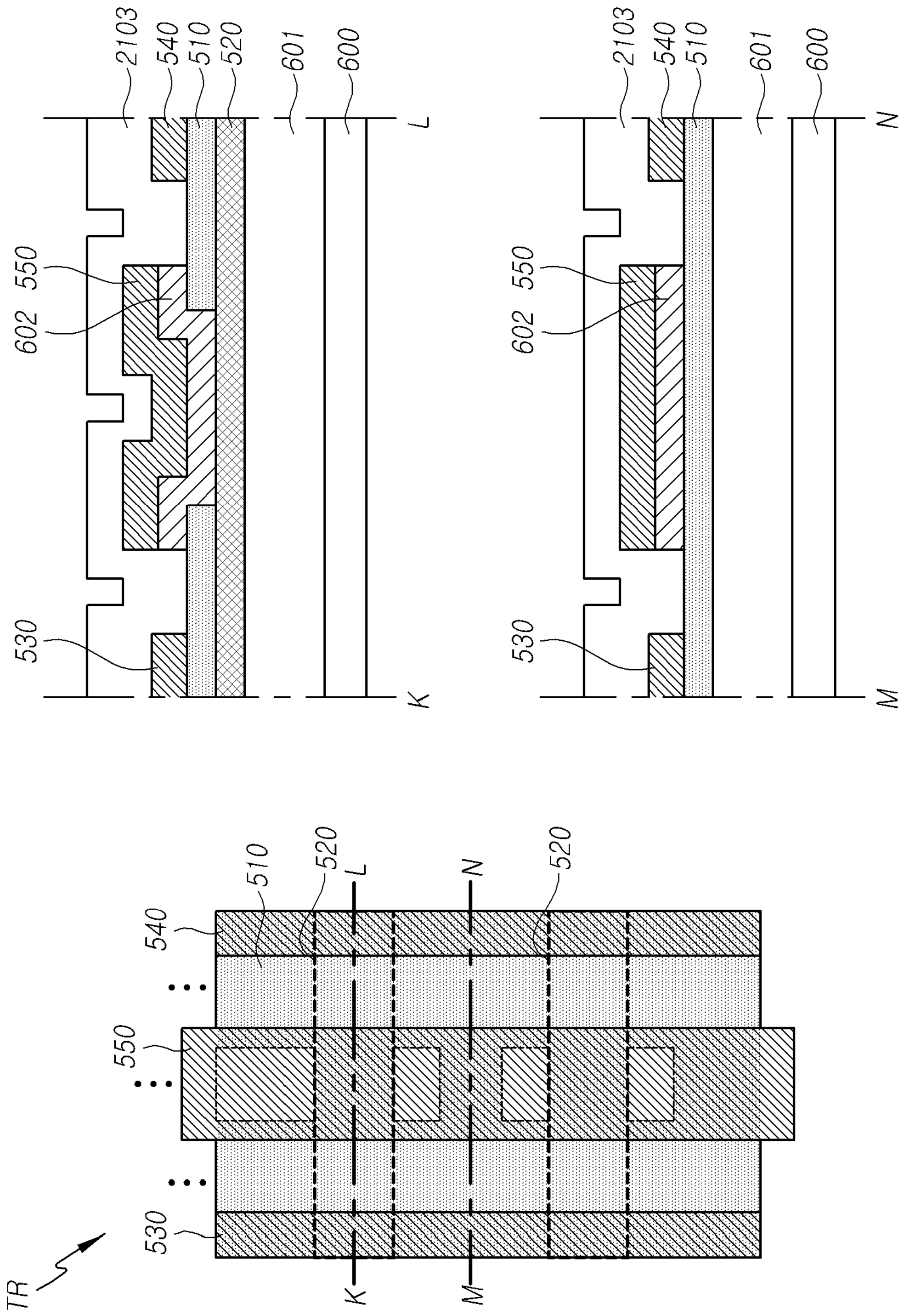
FIG. 23 illustrates an example structure in which one thin film transistor includes a plurality of first channel regions and a plurality of second channel regions in the display device according to aspects of the present disclosure.

FIG. 23 illustrates an example structure in which one thin film transistor includes a plurality of first channel regions and a plurality of second channel regions in the display device according to aspects of the present disclosure. Particularly, FIG. 23 on the left side shows the example structure of the thin film transistor TR, and FIG. 23 on the right side shows cross-sectional views cut along line K-L and M-N of the left side drawing.

In the following description, some configurations, effects etc., of the embodiments or examples discussed above may not be repeatedly described for convenience of description. It should be, however, understood that the scope of the present disclosure includes such omitted configurations already discussed above. Further, in the following description, like reference numerals will be used for configurations or elements equal to, or substantially or nearly equal to, those of embodiments or examples described above.

Referring to FIG. 23, in one or more embodiments, a thin film transistor TR can include one first active layer 510, a plurality of second active layers 520, one first electrode 530, one second electrode 540, and one third electrode 550. The one first active layer 510 can overlap the plurality of second active layers 520.

For example, referring to FIG. 23, the plurality of second active layers 520 can be disposed to be spaced apart from each other under the one first active layer 510.

The one first active layer 510 and the plurality of second active layers 520 included in the thin film transistor TR can share the one first electrode 530, the one second electrode 540, and the one third electrode 550.

Each of the plurality of second active layers 520 can include a second channel region CH2. The first channel region CH1 of the first active layer 510 can be disposed between the plurality of second channel regions CH2.

For example, the plurality of first channel regions CH1 and the plurality of second channel regions CH2 can be alternately disposed.

The plurality of first channel regions CH1 and the plurality of second channel regions CH2 can have a structure connected in parallel. In this manner, the thin film transistor TR can be implemented with a wide channel region, and thereby, the amount of current produced by the thin film transistor TR can increase.

As mentioned above, as one thin film transistor TR includes the first and second active layers 510 and 520, the reliability of the thin film transistor can also be ensured (see FIGS. 20 and 21).

Therefore, the thin film transistor TR shown in FIG. 23 can be applied as a large-sized transistor requiring a high current producing characteristic and a high reliability characteristic. For example, such a transistor can be applied to a gate driving circuit.

In one or more embodiments, thin film transistors can have a structure in which the entire remaining second active layer 520 except for the second channel region CH2 of the second active layer 520 and the first active layer 510 overlap each other.

Such a structure is further discussed with reference to FIGS. 24 to 28.

Figure 24:
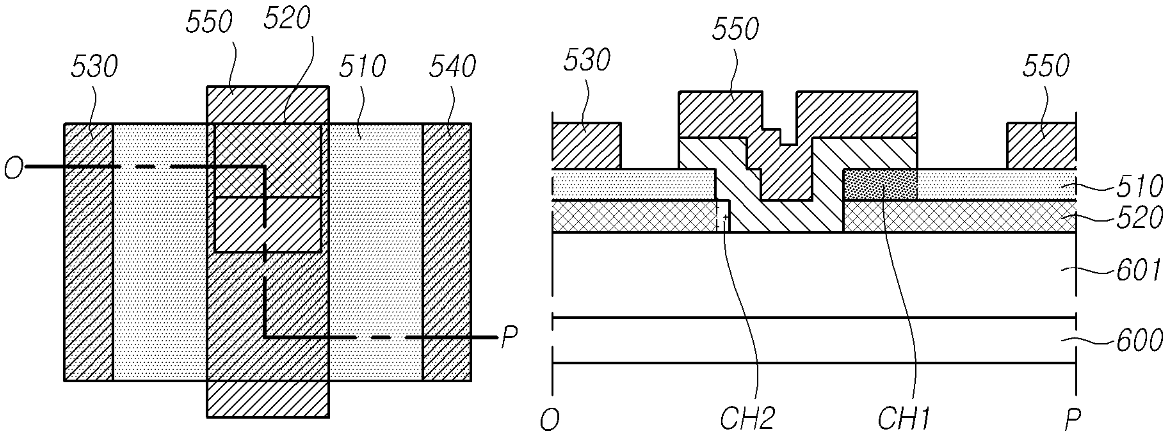
FIG. 24 illustrates an example thin film transistor structure in which a first active layer overlaps the entire remaining second active layer except for a second channel region of a second active layer in the display device according to aspects of the present disclosure.

FIG. 24 illustrates an example thin film transistor structure in which a first active layer overlaps the entire remaining second active layer except for a second channel region of a second active layer in the display device 100 according to aspects of the present disclosure. Particularly, FIG. 24 on the left side shows the example thin film transistor, and FIG. 24 on the right side shows a cross-sectional view cut along line O-P of the left side drawing. Further, FIGS. 25 to 28 schematically illustrate a process of forming the thin film transistor of FIG. 24.

In the following description, some configurations, effects etc., of the embodiments or examples discussed above may not be repeatedly described for convenience of description. It should be, however, understood that the scope of the present disclosure includes such omitted configurations already discussed above. Further, in the following description, like reference numerals will be used for configurations or elements equal to, or substantially or nearly equal to, those of embodiments or examples described above.

Figure 25:
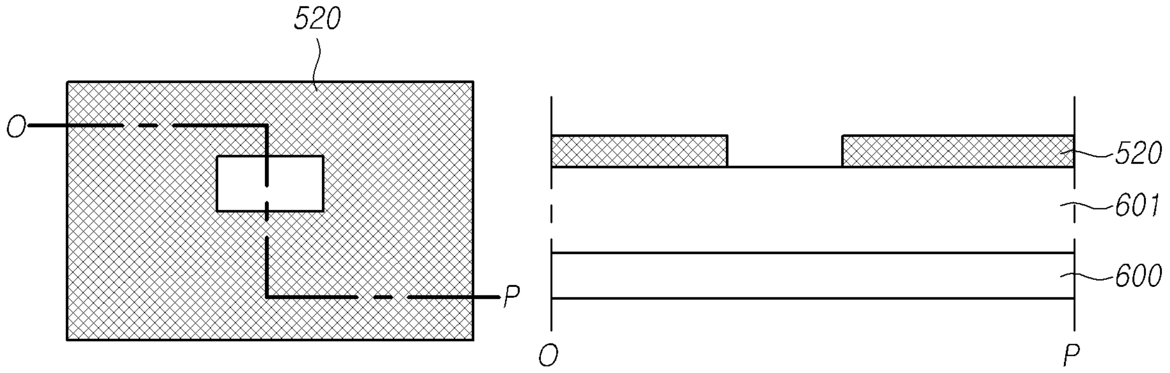
FIGS. 25 to 28 schematically illustrate a process of forming the thin film transistor of FIG. 24 according to aspects of the present disclosure.

Referring to FIGS. 24 and 25, a buffer layer 601 can be disposed on a substrate 600. A second active layer 520 can be disposed on the buffer layer 601.

Figure 26:
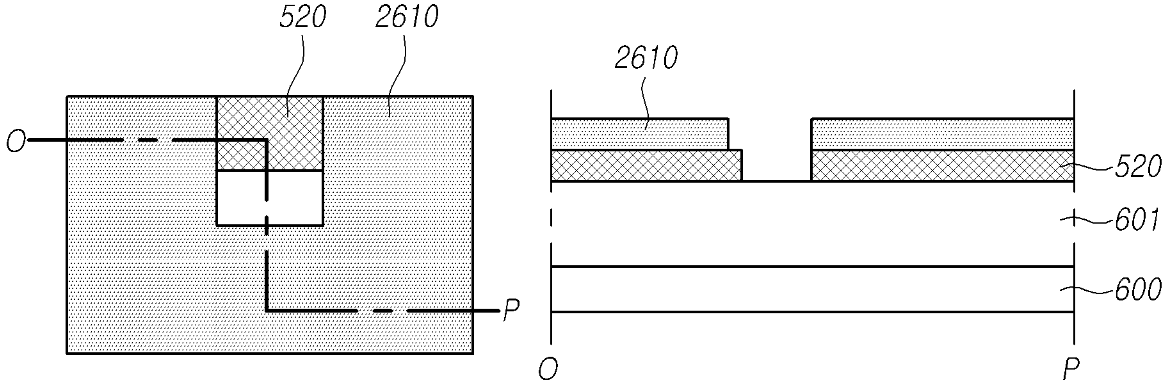

Referring to FIGS. 24 and 26, a first active layer pattern 2610 can be disposed on the substrate 600 on which the second active layer 520 is disposed. Referring to FIG. 26, the first active layer pattern 2610 can be disposed such that the first active layer pattern 2610 exposes a portion of the upper surface of the second active layer 520.

Figure 27:
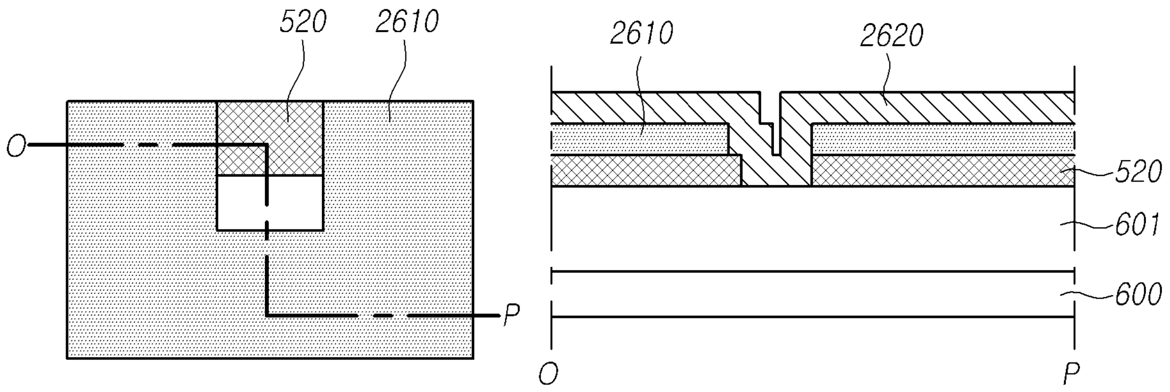

Thereafter, referring to FIG. 27, a gate insulating layer material 2620 can be disposed on the substrate 600 on which the first active layer pattern 2610 is disposed.

An electrode material can be disposed on the gate insulating layer material 2620.

The electrode material can be patterned through a mask process, and thereby, first to third electrodes 530, 540, and 550 spaced apart from each other can be formed.

Figure 28:
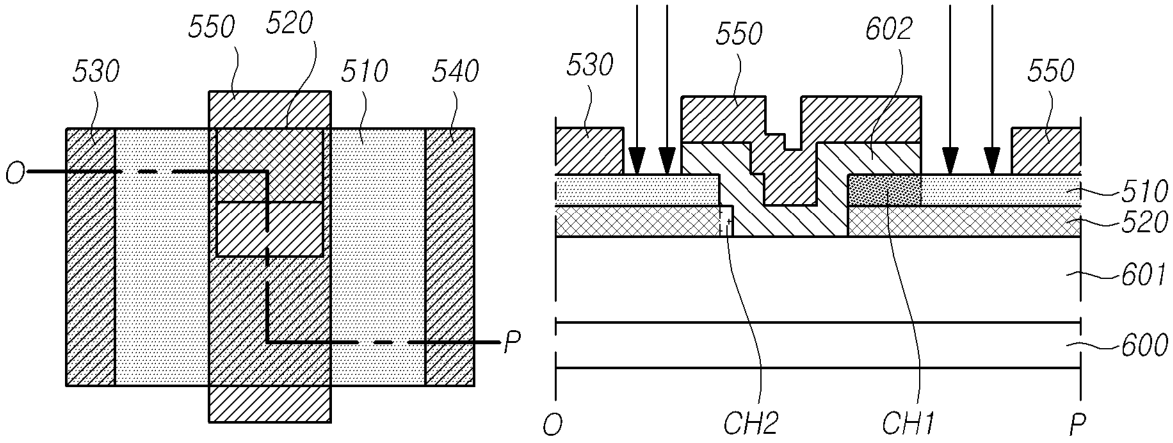

Referring to FIG. 28, a material of the gate insulating layer 602 can be patterned through a dry etching process, and thereby, the gate insulating layer 602 exposing a portion of the upper surface of the first active layer 510 can be formed.

In the dry etching process, the first active layer pattern located in an area where the first to third electrodes (530, 540, and 550) and the gate insulating layer 602 are not disposed can become conductive by plasma, and thereby, the first active layer 510 can be formed.

The first and second active layers 510 and 520 overlapping the gate insulating layer 602 can be non-conductive regions. Thus, the first active layer 510 can include a first channel region CH1, and the second active layer 520 can include a second channel region CH2.

The first channel region CH1 of the first active layer 510 can overlap the gate insulating layer 602 and the third electrode 550, but not overlap the second active layer 520.

The second channel region CH2 of the second active layer 520 can overlap the gate insulating layer 602 and the third electrode 550.

The embodiments of the present disclosure described above can be briefly discussed as follows.

The thin film transistor TR according to the embodiments described herein can include a first active layer 510 disposed on a substrate 600 and including a first channel region CH1; a second active layer 520 overlapping a portion of the first active layer 510, including a second channel region CH2, and not overlapping the first channel region CH1 of the first active layer 510; a first electrode 530 and a second electrode 540 disposed in respective portions of the first active layer

510 and the second active layer 520 and spaced apart from each other; a gate insulating layer 602 disposed in respective portions of the upper surfaces of the first active layer and the second active layer 520; and a third electrode 550 disposed on the gate insulating layer 602, wherein the first channel region CH1 of the first active layer 510 and the second channel region CH2 of the second active layer 520 are connected in parallel.

The thin film transistor TR according to the embodiments described herein can include a first active layer 510 disposed on a substrate 600 and including a first channel region CH1; a second active layer 520 overlapping a portion of the first active layer 510, including a second channel region CH2, and not overlapping the first channel region CH1 of the first active layer 510; a first electrode 530 and a second electrode 540 disposed in respective portions of the first active layer 510 and the second active layer 520 and spaced apart from each other; a gate insulating layer 602 disposed in respective portions of the upper surfaces of the first active layer and the second active layer 520; and a third electrode 550 disposed on the gate insulating layer 602.

According to the embodiments described herein, the display panel 110 and the display device 100 can be provided to have a structure in which one thin film transistor includes active layers including different materials and channel regions of the active layers are connected in parallel. Thereby, the display panel and the display device can have high capability and produce high performance by including thin film transistors with a high current producing characteristic and high reliability.

According to the embodiments described herein, the display panel 110 and the display device 100 can be provided to have a structure in which one transistor is configured to have a plurality of first channel regions and a plurality of second channel regions, which are alternately disposed. Thereby, the display panel and the display device can have high capability and produce high performance by including thin film transistors with a high current producing characteristic and high reliability disposed in a non-display area.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein can be applied to other embodiments and applications without departing from the scope of the present invention. The above description and the accompanying drawings provide examples of the technical features of the present invention for illustrative purposes only. For example, the disclosed embodiments are intended to illustrate the scope of the technical features of the present invention.

What is claimed is:

1. A display panel comprising:

a first active layer disposed on a substrate and comprising a first channel region;

a second active layer overlapping a portion of the first active layer, and comprising a second channel region not overlapping the first channel region of the first active layer;

first and second electrodes disposed in respective portions of the first active layer and the second active layer, respectively, and spaced apart from each other;

a gate insulating layer disposed in respective portions of upper surfaces of the first and second active layers; and a third electrode disposed on the gate insulating layer, wherein the first channel region of the first active layer and the second channel region of the second active layer are electrically connected in parallel to each other between the first and second electrodes.

2. The display panel of claim 1, wherein a material of the first active layer and a material of the second active layer are different from each other, and a mobility of the first active layer and a mobility of the second active layer are different from each other.

3. The display panel of claim 2, wherein each of the first active layer and the second active layer comprises at least one of Indium Zinc Oxide (IZO), Thin Transparent W-Doped Indium-ZincOxide (WIZO), Indium Gallium Zinc Oxide (IGZO), Indium Tin Zinc Oxide (ITZO), Indium Gallium Tin Zinc Oxide (IGTZO), Zinc Oxide Nitride (ZnON), and Indium Gallium Oxide (IGO).

4. The display panel of claim 1, wherein the second active layer is disposed under the first active layer, and the second active layer except for the second channel region overlaps the first active layer.

5. The display panel of claim 1, wherein a width of the first channel region is less than a width of the gate insulating layer, and a width of the second channel region is equal to or less than the width of the gate insulating layer.

6. The display panel of claim 1, wherein an area of the first active layer, except for areas overlapping the first electrode, the second electrode, and the third electrode, is a conductivity-enabled area.

7. The display panel of claim 1, wherein:

the first electrode, the second electrode, and the third electrode spaced apart from each other are disposed on the substrate;

the second active layer is disposed under the first active layer disposed under the first electrode;

the first active layer and the second active layer disposed under the first active layer are disposed in a portion of an area between the first electrode and the third electrode;

the first active layer and the second active layer disposed under the first active layer are disposed in a portion of an area between the third electrode and the second electrode;

the first active layer and the second active layer disposed under the first active layer are disposed under the second electrode;

an entire second channel region of the second active layer overlaps a portion of the third electrode; and an area of the first active layer disposed around the second channel region on the second active layer and overlapping the third electrode is at least a portion of a remaining area of the first active layer except for the first channel region.

8. The display panel of claim 1, wherein the first active layer comprises:

a first portion extending in a first direction and partially overlapping the second active layer;

a second portion spaced apart from the first portion, extending in the first direction, and partially overlapping the second active layer; and a third portion disposed between the first portion and the second portion, not overlapping the second active layer, and including the first channel region.

9. The display panel of claim 8, wherein:

the first electrode is disposed on a portion of the first portion;

the second electrode is disposed on a portion of the second portion;

each of the first electrode and the second electrode overlaps an area of the first active layer disposed on the second active layer and a portion of an area of the first active layer not overlapping the second active layer; and the third electrode overlaps the third portion of the first active layer.

10. The display panel of claim 1, wherein the first active layer comprises:

a first portion extending in a first direction and overlapping the second active layer;

a second portion spaced apart from the first portion, extending in the first direction, and overlapping the second active layer; and a third portion disposed between the first portion and the second portion, overlapping the second active layer, and including the first channel region.

11. The display panel of claim 10, wherein:

the first electrode is disposed on a portion of the first portion;

the second electrode is disposed on a portion of the second portion; and an entirety of each of the first electrode and the second electrode overlaps the first active layer and the second active layer.

12. The display panel of claim 10, wherein the first channel region of the first active layer overlaps the second active layer, and the second channel region of the second active layer does not overlap the first active layer.

13. The display panel of claim 1, wherein the first channel region and the second channel region are spaced apart from each other.

14. The display panel of claim 1, wherein an area of the first channel region is about ⅓ to 3 times an area of the second channel region.

15. The display panel of claim 1, wherein the first active layer overlaps a plurality of second active layers.

16. The display panel of claim 15, wherein the plurality of second active layers are disposed spaced apart from each other under the first active layer, and each of the plurality of second active layers comprises a second channel region.

17. The display panel of claim 16, wherein the first channel region of the first active layer is disposed between the plurality of second channel regions.

18. The display panel of claim 16, wherein the first active layer and the plurality of second active layers are disposed in a gate driving circuit.

19. The display panel of claim 1, further comprising:

at least one insulating layer disposed on the first electrode, the second electrode, and the third electrode; and an anode electrode disposed on the at least one insulating layer, wherein the anode electrode is electrically connected to the first electrode or the second electrode through a contact hole formed in the at least one insulating layer.

20. The display panel of claim 19, wherein the anode electrode extends to a light emitting area, and in the light emitting area, an emission layer and a cathode electrode disposed on the emission layer are disposed on the anode electrode.

21. The display panel of claim 1, further comprising:

a light shield disposed under the second active layer, wherein the light shield forms a storage capacitor by overlapping a first storage capacitor electrode disposed on a same layer as the first active layer and a second storage capacitor electrode disposed on a same layer as the first to third electrodes.

22. The display panel of claim 21, wherein an entire area of the first and second channel regions overlaps the light shield.

23. The display panel of claim 3, wherein the first active layer includes indium zinc oxide, and an indium content of the first active layer is about 50% to 70%, and wherein the second active layer includes indium gallium zinc oxide, and an indium content of the second active layer is from about 75% or more to less than 100%.

24. The display panel of claim 1, wherein the gate insulating layer is disposed on a portion of the first active layer overlapping the second active layer, is disposed on a portion of the second active layer not overlapping the first active layer, and is disposed in a portion of an area not overlapping the first active layer among an area located under the first active layer.

25. The display panel of claim 1, wherein the first active layer and the second active layer, which have respective channel regions located in different areas, share one first electrode, one second electrode, and one third electrode.

26. The display panel of claim 1, wherein the first and second channel regions include different oxide semiconductor materials.

27. A display device comprising:

a display panel and a driving circuit configured to drive the display panel, wherein the display panel includes:

a first active layer disposed on a substrate and comprising a first channel region;

a second active layer overlapping a portion of the first active layer, and comprising a second channel region not overlapping the first channel region of the first active layer;

first and second electrodes disposed in respective portions of the first active layer and the second active layer, respectively, and spaced apart from each other;

a gate insulating layer disposed in respective portions of upper surfaces of the first and second active layers; and a third electrode disposed on the gate insulating layer, wherein the first channel region of the first active layer and the second channel region of the second active layer are electrically connected in parallel to each other between the first and second electrodes.

28. The display device of claim 27, wherein the first and second channel regions include different oxide semiconductor materials.

29. The display device of claim 27, wherein a ratio of an area of the first channel region to an area of the second channel region is about 1:3 to 3:1.

30. The display panel of claim 1, wherein a portion of the first active layer and a portion of the second active layer directly contact each other, and wherein at least a portion of both the first active layer and the second active layer are not overlapped by the third electrode.

* * * * *